(12) United States Patent
Makino

(10) Patent No.: US 6,946,231 B2
(45) Date of Patent: Sep. 20, 2005

(54) PRESENSITIZED LITHOGRAPHIC PLATE COMPRISING MICROCAPSULES

(75) Inventor: Naonori Makino, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 40 days.

(21) Appl. No.: 10/636,766

(22) Filed: Aug. 8, 2003

(65) Prior Publication Data

US 2004/0031408 A1 Feb. 19, 2004

(30) Foreign Application Priority Data

Aug. 19, 2002 (JP) ........................................ 2002-238284
Jan. 15, 2003 (JP) ........................................ 2003-006757

(51) Int. Cl.⁷ .............................................. G03F 7/004
(52) U.S. Cl. ................. 430/138; 430/270.1; 430/281.1; 430/284.1; 430/286.1; 430/302; 430/309; 430/434; 430/494; 430/944; 430/945
(58) Field of Search .............................. 430/138, 270.1, 430/281.1, 282.1, 284.1, 285.1, 286.1, 287.1, 302, 309, 434, 494, 944, 945

(56) References Cited

U.S. PATENT DOCUMENTS

| | | | | |
|---|---|---|---|---|
| 4,963,458 A | * | 10/1990 | Ishikawa et al. | ............ 430/138 |
| 6,653,042 B1 | * | 11/2003 | Fukino et al. | ........... 430/270.1 |
| 6,686,125 B2 | * | 2/2004 | Hoshi et al. | ............. 430/271.1 |
| 2003/0113666 A1 | * | 6/2003 | Endo | ....................... 430/281.1 |

FOREIGN PATENT DOCUMENTS

EP 1 057 622 A2 * 12/2000 ............. B41C/1/10

* cited by examiner

Primary Examiner—Barbara L. Gilliam
(74) Attorney, Agent, or Firm—Sughrue Mion, PLLC

(57) ABSTRACT

A presensitized lithographic printing plate comprises a hydrophilic support and an image-forming layer. The image-forming layer contains microcapsules. The microcapsules consist of a shell and a core. The shell comprises a polymer. The polymer has a decomposition temperature in the range of 150 to 280° C. The core comprises a polymerizable compound.

20 Claims, 1 Drawing Sheet

PRESENSITIZED LITHOGRAPHIC PLATE COMPRISING MICROCAPSULES

FIELD OF THE INVENTION

The present invention relates to a presensitized lithographic plate. In more detail, the invention relates to a presensitized lithographic plate that can be scanned with a laser beam according to digital signals to record an image.

BACKGROUND OF THE INVENTION

A lithographic printing plate generally comprises a hydrophobic imaging area, which receives oily ink in a printing process, and a hydrophilic non-imaging area, which receives dampening water. A conventional lithographic process usually comprises steps of masking a presensitized (PS) plate, which comprises a hydrophilic support and a hydrophobic photosensitive resin layer, with a lith film, exposing the plate to light through the lith film, and then developing the plate to remove a non-imaging area with a developing solution.

Nowadays a computer electronically processes, stores and outputs image information as digital data. A presensitized lithographic plate is preferably scanned directly with a highly directive active radiation such as a laser beam without use of a lith film to form an image according to a digital data. The term of Computer to Plate (CTP) means the lithographic process of forming a printing plate according to digital image data without use of a lith film.

The CTP system preferably uses a presensitized lithographic plate that can be attached to a press to print immediately after exposure without a development process.

A method without the development process is referred to as an on-press development method, which comprises steps of attaching an exposed presensitized printing plate to a cylinder of a printer, and rotating the cylinder while supplying dampening water and ink to the plate to remove a non-imaging area from the plate. Immediately after exposing the presensitized plate to light, the plate can be installed in a printer. A lithographic process can be completed while conducting an usual printing treatment.

A presensitized lithographic printing plate suitable for the on-press development method must have a photosensitive layer soluble in dampening water or a solvent of ink. The presensitized plate should easily be treated under room light to be subjected to an on-press development in a printer placed under room light.

Japanese Patent No. 2,938,397 (corresponding to European Patent No. 0770494, and U.S. Pat. Nos. 6,030,750 and 6,096,481) discloses a method for making a lithographic printing plate. The method uses an imaging element (presensitized plate) comprising on a hydrophilic surface of a lithographic based an image forming layer comprising hydrophobic thermoplastic polymer particles capable of coalescing under the influence of heat and dispersed in a hydrophilic binder and a compound capable of converting light to heat. The method comprises steps of imagewise exposing to light the imaging element; and developing a thus obtained imagewise exposed imaging element by mounting it on a print cylinder of a printing press and supplying an aqueous dampening liquid or ink to the image forming layer while rotating the printer cylinder. The imaging element can be treated under room light because the element has sensitivity within an infrared region.

Japanese Patent Provisional Publication No. 9(1997)-127683 and International Patent Publication No. WO99/10189 also disclose a presensitized lithographic plate comprising thermoplastic particles, which can be treated at an on-press development.

Japanese Patent Provisional Publication No. 2001-277740, 2002-29162 and 2002-137562 disclose a presensitized lithographic plate comprising microcapsules in place of thermoplastic particles. The microcapsules contain a thermally reactive compound.

SUMMARY OF THE INVENTION

A presensitized lithographic plate comprising thermoplastic particles has a problem of poor plate wear, since a membrane formed by coalescence of the particles is mechanically weak. The presensitized lithographic plate comprising thermoplastic particles has another problem that sensitivity is changed according to storage conditions while storing the presensitized lithographic plate. Further, it is difficult to remove non-imaging area completely from the printing plate at an on-press development. The remaining non-imaging area causes stain on background.

The above-mentioned problems are relatively not serious where a presensitized lithographic plate comprises microcapsules containing a thermally reactive compound in place of thermoplastic particles. However, the problems are not completely solved by using the microcapsules.

A presensitized lithographic plate comprising microcapsules has been proposed to solve the above-mentioned problems. However, the problems have not yet been solved completely even if the microcapsules are used in place of the particles.

An object of the present invention is to process a highly sensitive and stable presensitized lithographic plate at an on-press development to form a lithographic printing plate improved in plate wear.

The present invention provides a presensitized lithographic printing plate which comprises a hydrophilic support and an image-forming layer containing microcapsules which have a shell comprising a polymer and a core comprising a polymerizable compound, wherein the polymer has a decomposition temperature in the range of 150 to 280° C.

The invention also provides a lithographic process comprising the steps of: imagewise heating a presensitized lithographic printing plate which comprises a hydrophilic support and an image-forming layer containing microcapsules which have a shell comprising a polymer and a core comprising a polymerizable compound, said polymer having a decomposition temperature in the range of 150 to 280° C., whereby the shell is decomposed and the polymerizable compound is polymerized to form a hydrophobic area; and removing the unheated area of the image-forming layer to form a lithographic printing plate.

The invention further provides a lithographic printing process comprising the steps of: imagewise heating a presensitized lithographic printing plate which comprises a hydrophilic support and an image-forming layer containing microcapsules which have a shell comprising a polymer and a core comprising a polymerizable compound, said polymer having a decomposition temperature in the range of 150 to 280° C., whereby the shell is decomposed and the polymerizable compound is polymerized to form a hydrophobic area; working a printer to remove the unheated area of the image-forming layer and to form a lithographic printing plate while attaching the plate to the printer; and printing with the formed plate by supplying oily ink and dampening water to the plate.

The shell polymer preferably is polyurethane, polyurea or a copolymer thereof, which is more preferably is a reaction product of a polyol and a polyisocyanate. The polyol preferably has phenolic hydroxyl groups, and more preferably has three or more phenolic hydroxyl groups. The polyol is preferably represented by the formula (I):

$$L^1(-Ar-OH)_n \qquad (I)$$

in which $L^1$ is an n-valent linking group; Ar is an arylene group or a substituted arylene group; and n is an integer of 2 or more.

The shell polymer preferably contains a thermally decomposable bond having a decomposition temperature that is lower than a decomposition temperature of a urethane bond or a urea bond contained in the polyurethane, the polyurea or the copolymer thereof. A difference between the decomposition temperature of the thermally decomposable bond and the decomposition temperature of the urethane bond or the urea bond preferably is 10° C. or more. The thermally decomposable bond preferably is a sulfonic ester bond. The polyol preferably contains a sulfonic ester bond. The polyol is also preferably represented by the formula (II):

$$L^2(-SO_3-L^3-OH)_m \qquad (II)$$

in which $L^2$ is an m-valent linking group; —$SO_3$— is —$SO_2$—O— or —O—$SO_2$—; $L^3$ is a divalent linking group; and m is an integer of 2 to 6.

The polyisocyanate preferably is a diisocyanate, and more preferably is xylylene diisocyanate.

The polymerizable compound can has an ethylenically unsaturated group, and the image-forming layer can further contain a thermal polymerization initiator.

The polymerizable compound can be a vinyl ether or a cyclic ether, and the image-forming layer can further contain a heat sensitive acid precursor.

The image-forming layer or another optional layer can further contain an agent capable of converting light to heat. The microcapsules can contain the agent capable of converting light to heat.

The presensitized lithographic plate according to the present invention is characterized in that the shell polymer of the microcapsules has a decomposition temperature in the range of 150 to 280° C. The polymer is decomposed at the decomposition temperature to rupture the shell of the microcapsules. The shell is ruptured to release core of the microcapsules at the decomposition temperature.

The present inventor has found that the shell polymer of prior art has a high decomposition temperature. Where the decomposition temperature is high, a presensitized lithographic plate has a low sensitivity, since a high energy is required to rupture microcapsules. On the other hand, a presensitized lithographic plate has a poor stability where the decomposition temperature is low. In the prior art, a shell polymer has been selected in consideration of the stability rather than the sensitivity.

The present inventor has further found that the sensitivity can be improved without causing the problem of the stability when the decomposition temperature of the shell polymer is relatively low (150 to 280° C.) compared with the prior art.

According to the present invention, a highly sensitive and stable presensitized lithographic plate can be processed at an on-press development to form a lithographic printing plate improved in plate wear.

DETAILED DESCRIPTION OF THE INVENTION

[Basic Structure of Presensitized Lithographic Plate]

Figure 1:
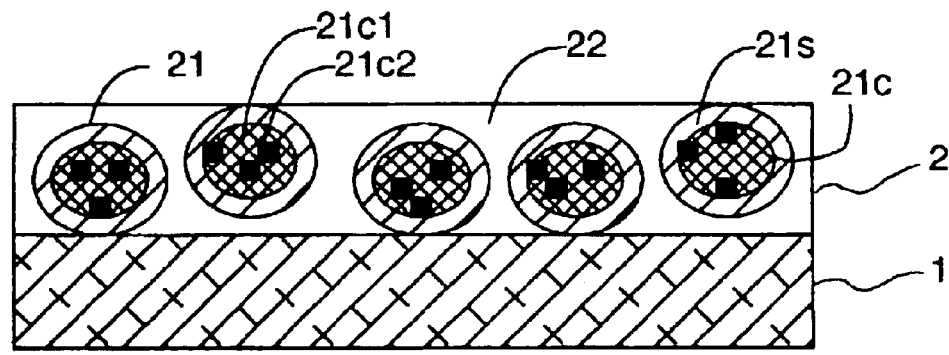
FIG. 1 is a sectional view schematically illustrating an embodiment of a presensitized lithographic plate.

FIG. 1 is a sectional view schematically illustrating an embodiment of a presensitized lithographic plate.

The presensitized lithographic plate shown in FIG. 1 comprises a hydrophilic support (1) and an image-forming layer (2).

The image-forming layer (2) contains microcapsules (21). In the presensitized lithographic plate shown in FIG. 1, the microcapsules (21) are dispersed in the image-forming layer (2). Each of the microcapsules (21) has a core (21c) and a shell (21s). The core (21c) comprises a polymerizable compound(21c1), and the shell (21s) comprises a polymer. In the presensitized lithographic plate shown in FIG. 1, the core (21c) further comprises an agent capable of converting light to heat (21c1).

[Shell of Microcapsules]

In a presensitized lithographic printing plate according to the present invention, a shell of microcapsules comprises a polymer having a decomposition temperature (temperature of initiating a thermal decomposition) in the range of 150 to 280° C. The decomposition temperature is measured by heating a polymer at a heating rate of 10° C. per minutes.

The decomposition temperature of the polymer can be measured by forming a polymer film on an appropriate support to form a sample. The sample is heated in the air at a heating rate of 10° C. per minutes while measuring the mass of the sample continuously.

Figure 2:
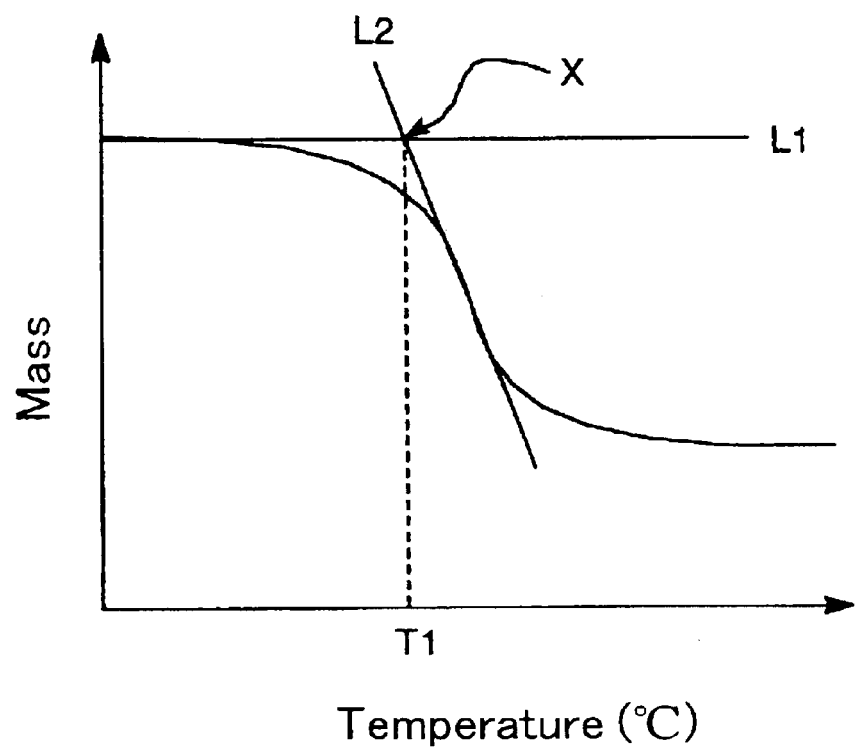
FIG. 2 is a chart in which mass and temperature of a polymer are plotted to determine decomposition temperature.

FIG. 2 is a chart in which mass and temperature of a polymer are plotted to determine decomposition temperature. The ordinate means a mass, and the abscissa means the temperature (° C.).

The chart shows an intersection point (X) of a tangent (L1) of a curve (where the curve is most approximated to a line) before the mass is reduced and a tangent (L2) of a curve (where the curve is most approximated to a line) after the mass is reduced. The decomposition temperature of the polymer can be obtained as a temperature (T1) of the intersection point (X).

The polymer having the low decomposition temperature preferably is polyurethane, polyurea, polyester, polyamide, a copolymer thereof or a mixture thereof, more preferably is polyurethane, polyurea, a copolymer thereof or a mixture thereof, and most preferably is polyurethane, polyurea or a copolymer thereof.

The polyurethane is a polymer having a urethane bond (—NH—CO—O—) in its main chain, the polyurea is a polymer having a urea bond (—NH—CO—NH—) in its main chain, the polyester is a polymer having an ester bond (—CO—O—) in its main chain, the polyamide is a polymer having an amide bond (—CO—NH—) in its main chain, and the copolymer is a polymer having two or more kinds of the bonds in its main chain.

The polyurethane, the polyurea and the copolymer thereof can be synthesized by a reaction of a polyol and a polyisocyanate. The polyurethane, the polyurea and the copolymer thereof can also be synthesized by a condensation reaction of a polyisocyanate and a polyamine, which can be formed by a hydrolysis of a polyisocyanate. In a synthesis reaction of a shell polymer of microcapsules, 1 mole of n-valent polyol can be reacted with n moles of polyisocyanate to form adducts as intermediates, which can be reacted to synthesize the shell polymer. In a practical reaction system, 1 mole of n-valent polyol is usually reacted with an excess (more than n moles) amount of polyisocyanate.

The polyol preferably is tri-functional or more, and more preferably is tri-functional.

A phenolic (aromatic) polyol is preferred to an alcoholic (aliphatic) polyol. The polyol more preferably is a compound in which two or more hydroxyaryl groups are connected by a single bond or a linking group.

The polyol most preferably is represented by the formula (I).

$$L^1(-Ar-OH)_n \quad (I)$$

In the formula (I), $L^1$ is an n-valent linking group, Ar is an arylene group or a substituted arylene group, and n is an integer of 2 or more.

In the case that n is 2, $L^1$ preferably is a single bond or a divalent group selected from the group consisting of an alkylene group, a substituted alkylene group, an arylene group, a substituted arylene group, —O—, —S—, —CO—, —S—, —SO$_2$—, —NH—, —NR— (wherein R is an alkyl group or a substituted alkyl group), silanediyl (—SiH$_2$—), a substituted silanediyl group and a combination thereof.

The alkylene group, the alkylene moiety of the substituted alkylene group, the alkyl group and the alkyl moiety of the substituted alkyl group can have a cyclic or branched structure. The alkylene group, the alkylene moiety of the substituted alkylene group, the alkyl group and the alkyl moiety of the substituted alkyl group preferably have 1 to 20 carbon atoms, more preferably has 1 to 15 carbon atoms, further preferably has 1 to 10 carbon atoms, and most preferably has 1 to 8 carbon atoms.

Examples of the substituent groups of the substituted alkylene group and the substituted alkyl group include a halogen atom (F, Cl, Br, I), an aryl group, a substituted aryl group and an alkoxy group.

The arylene group and the arylene moiety of the substituted arylene group preferably is phenylene, and more preferably is p-phenylene. The aryl group and the aryl moiety of the substituted aryl group preferably is phenyl.

Examples of the substituent groups of the substituted arylene group, the substituted aryl group and the substituted silanediyl group include a halogen atom (F, Cl, Br, I), an alkyl group, a substituted alkyl group, an aryl group, a substituted aryl group and an alkoxy group.

The alkyl moiety of the alkoxy group is the same as the alkyl group or the substituted alkyl group.

In the case that n is 3 or more, $L^1$ preferably is a trivalent or more aliphatic group, a trivalent or more aromatic group, —N<, or a combination of at least one of a trivalent or more aliphatic group, a trivalent or more aromatic group and —N< with at least one divalent group selected from the group consisting of an alkylene group, a substituted alkylene group, an arylene group, a substituted arylene group, —O—, —S—, —CO—, —S—, —SO$_2$—, —NH—, —NR— (wherein R is an alkyl group or a substituted alkyl group), silanediyl (—SiH$_2$—) and a substituted silanediyl group.

The trivalent or more aliphatic group preferably is a saturated aliphatic group. The aliphatic group can have a cyclic or branched structure. The aliphatic group preferably has 1 to 20 carbon atoms, more preferably has 1 to 15 carbon atoms, further preferably has 1 to 10 carbon atoms, and most preferably has 1 to 8 carbon atoms.

The aliphatic group can have a substituent group. Examples of the substituent groups include a halogen atom (F, Cl, Br, I), an aryl group, a substituted aryl group and an alkoxy group.

The trivalent or more aromatic group preferably is a residue (radical) of benzene ring. The aromatic group can have a substituent group. Examples of the substituent groups include a halogen atom (F, Cl, Br, I), an alkyl group, a substituted alkyl group, an aryl group, a substituted aryl group and an alkoxy group.

Examples of the polyols represented by the formula (I) are shown below.

(1)

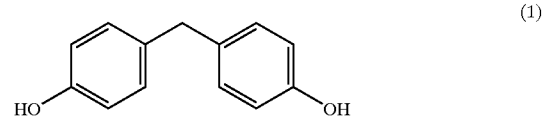
(2)

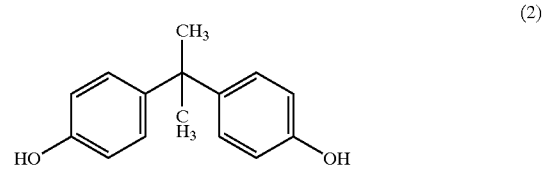
(3)

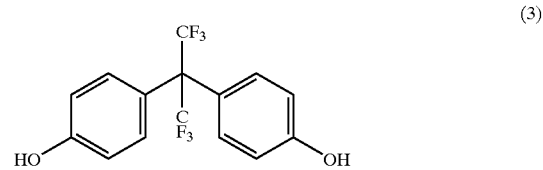
(4)

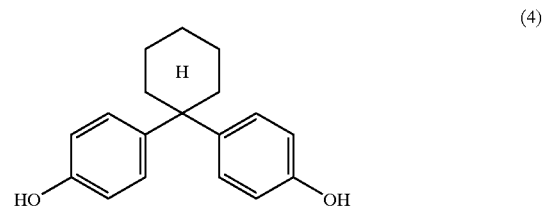
(5)

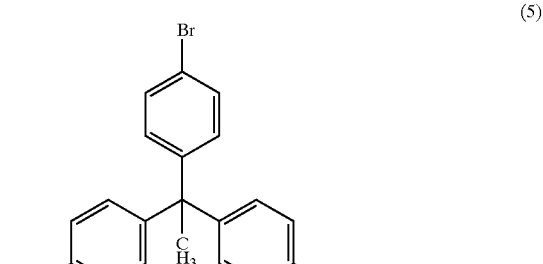
(6)

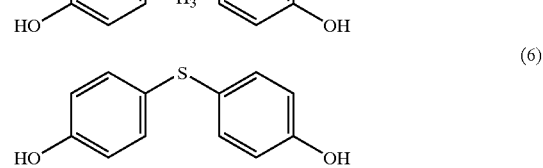
(7)

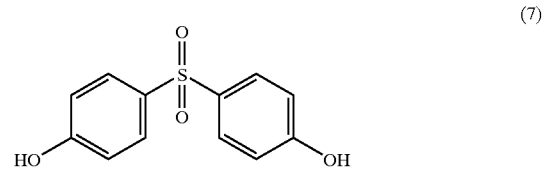
(8)

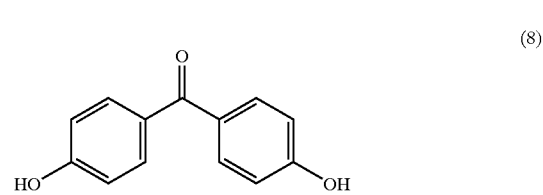
(9)

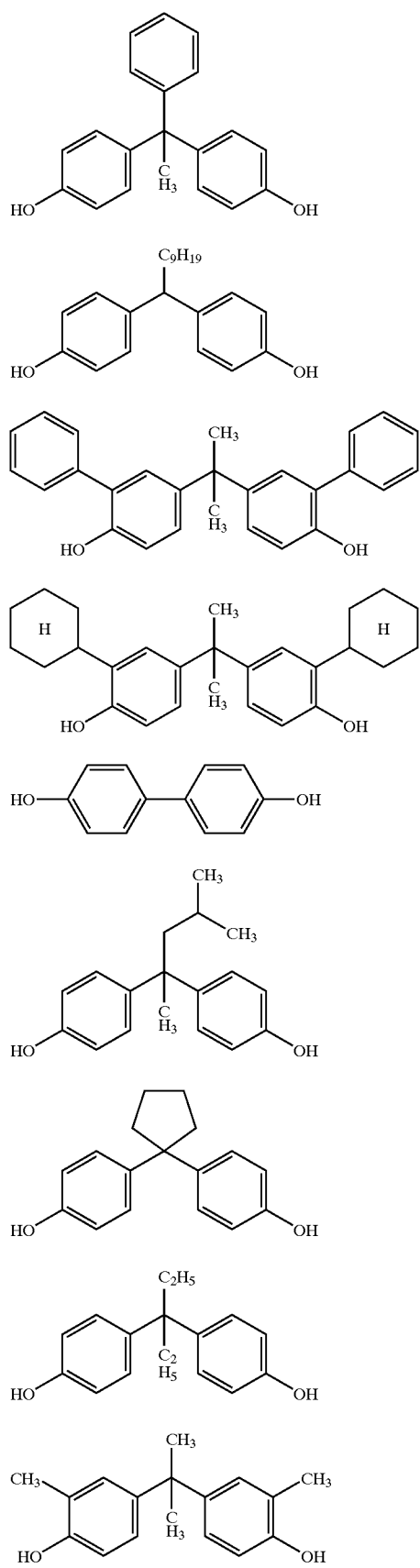
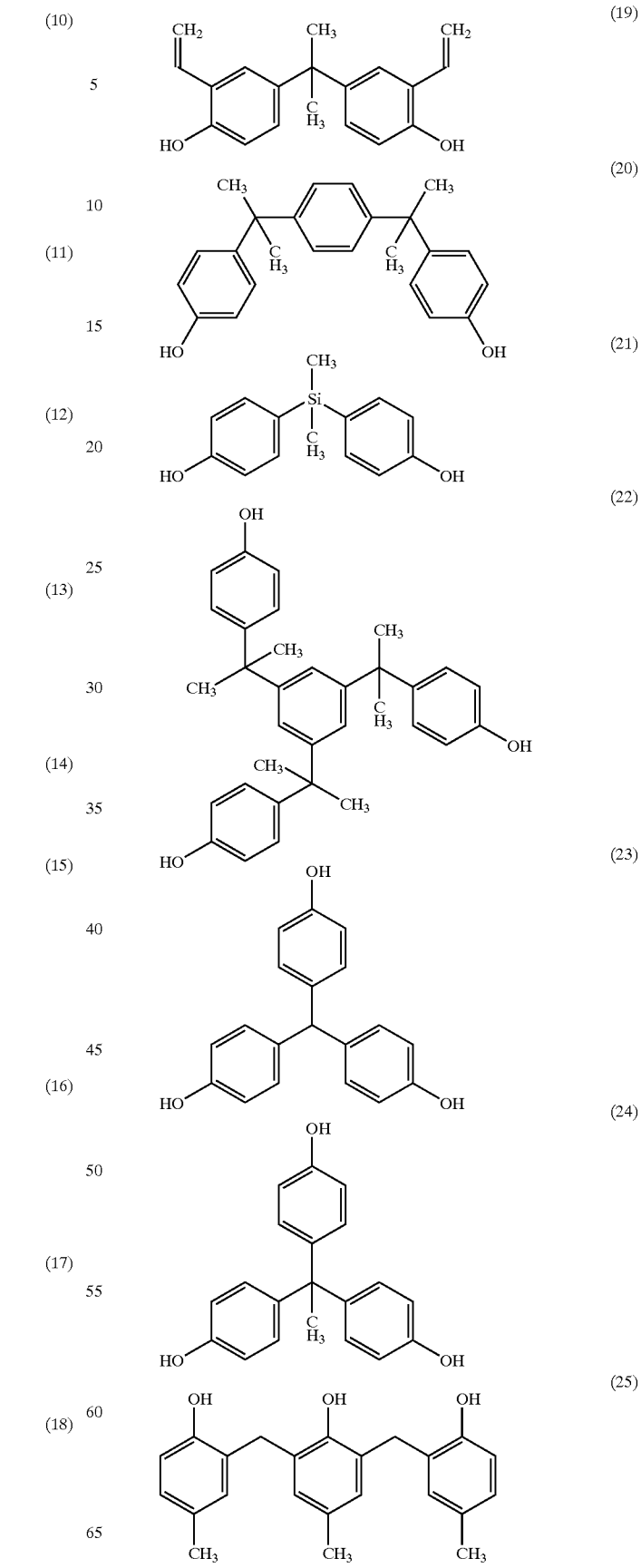

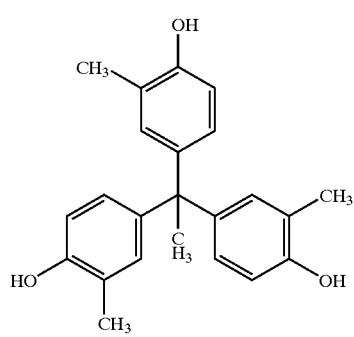
(26)
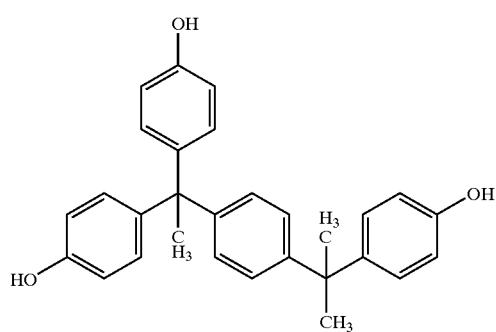
(27)
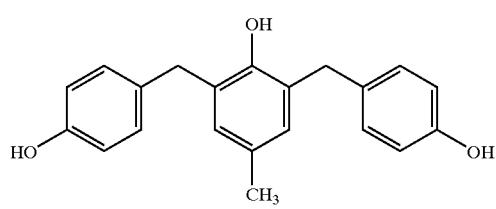
(28)
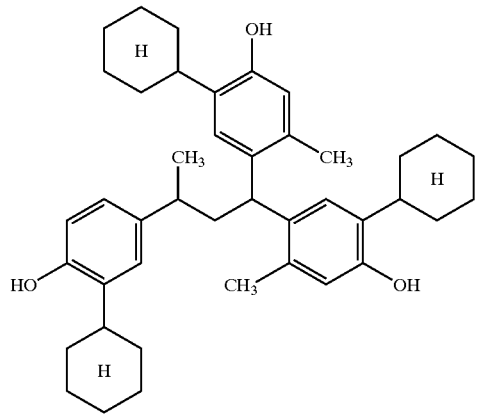
(29)
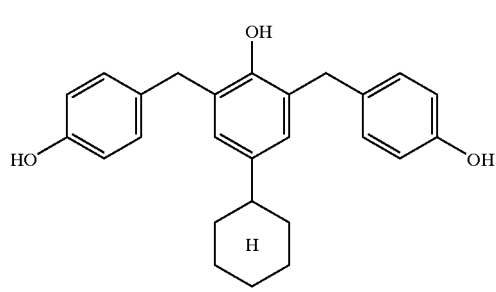
(30)
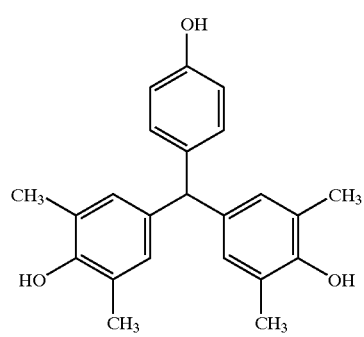
(31)
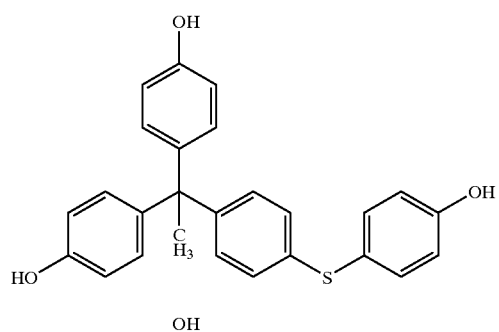
(32)
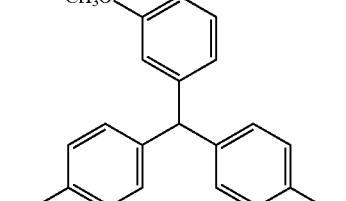
(33)
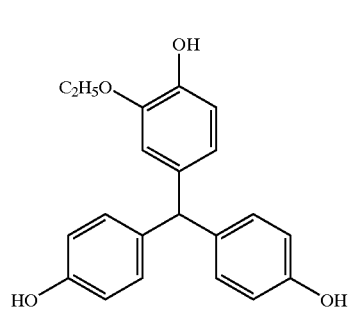
(34)
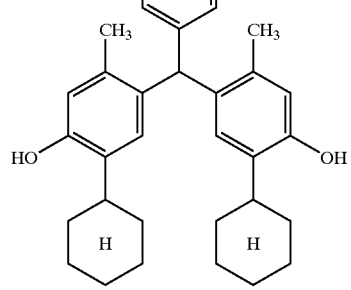
(35)

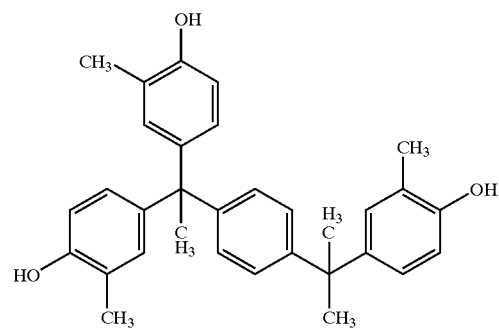
(36)
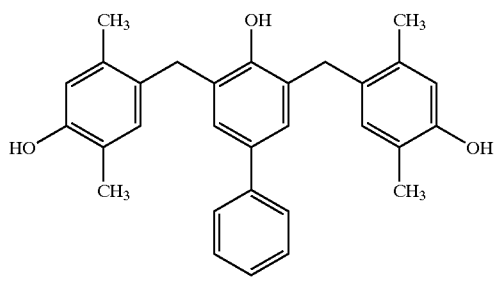
(42)
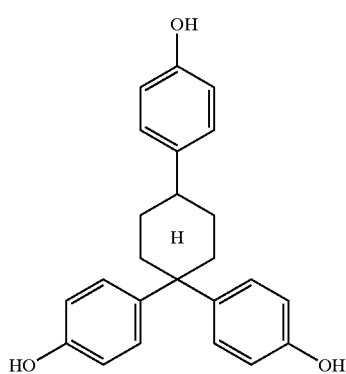
(37)
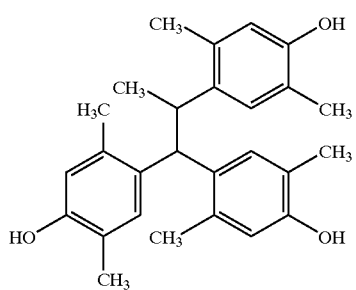
(38)
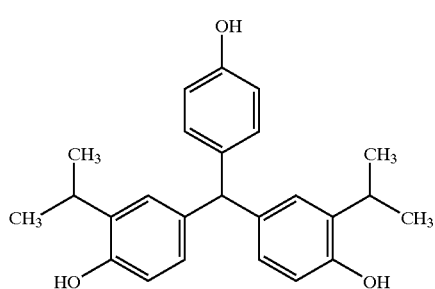
(43)
(39)
(44)
(40)
(45)
(41)
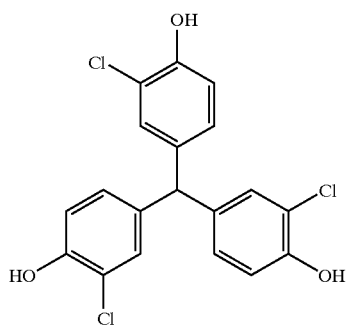
(46)

-continued

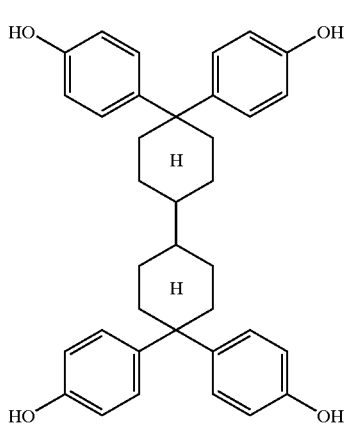
(47)

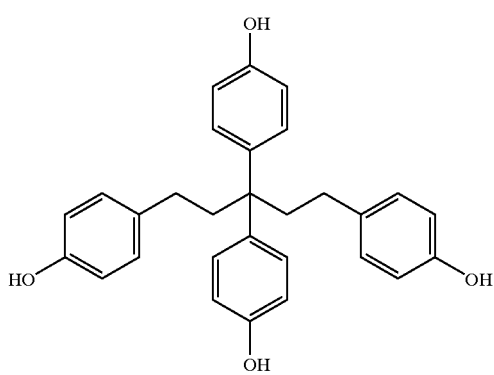
(48)

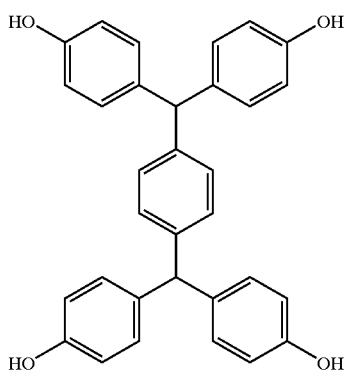
(49)

The shell polymer preferably contains a thermally decomposable bond having a decomposition temperature that is lower than a decomposition temperature of a urethane bond or a urea bond contained in the polyurethane, the polyurea or the copolymer thereof. A difference between the decomposition temperature of the thermally decomposable bond and the decomposition temperature of the urethane bond or the urea bond preferably is 5° C. or more, and more preferably is 10° C. or more. The thermally decomposable bond preferably is a sulfonic ester bond (—$SO_2$—O— or —O—$SO_2$—), which is preferably contained in a polyol rather than polyisocyanate.

The polyol having a sulfonic ester bond is preferably represented by the, formula (II).

(II)

In the formula (II), $L^2$ is an m-valent linking group, and m is an integer of 2 to 6. $L^2$ preferably is selected from the group consisting of a divalent or more aliphatic group, a divalent or more aromatic group, a divalent or more heterocyclic group, —O—, —S—, —NH—, —N<, —CO—, —SO—, —$SO_2$— and a combination thereof, more preferably is selected from the group consisting of a divalent or more aliphatic group, a divalent or more aromatic group and a combination thereof, and most preferably is a divalent or more aromatic group or a combination of a divalent or more aromatic group and a divalent or more aliphatic group. In the formula (II), m more preferably is 2, 3 or 4, and more preferably is 2 or 3.

In the formula (II), —$SO_3$— is —$SO_2$—O— or —O—$SO_2$—, wherein —$SO_2$—O— is preferred to —O—$SO_2$—.

In the formula (II), $L^3$ is a divalent linking group. $L^3$ preferably is selected from the group consisting of a divalent aliphatic group, a divalent aromatic group, a divalent heterocyclic group, —O—, —S—, —CO—, —SO—, —$SO_2$—, —NH—, —NR— (wherein R is an alkyl group or a substituted alkyl group) and a combination thereof, more preferably is selected from the group consisting of a divalent aliphatic group, —O—, —CO—, —NH— and a combination thereof, and most preferably is a divalent aliphatic group.

In the present specification, the aliphatic group can have a cyclic or branched structure. The aliphatic group preferably has 1 to 20 carbon atoms, more preferably has 1 to 15 carbon atoms, further preferably has 1 to 10 carbon atoms, furthermore preferably has 1 to 8 carbon atoms, and most preferably has 1 to 6 carbon atoms.

The aliphatic group can have a substituent group. Examples of the substituent groups include a halogen atom (F, Cl, Br, I), amino, hydroxyl, mercapto, carboxyl, sulfo, a sulfonic ester group (—$SO_2$—O—R or —O—$SO_2$—R), phosphono, a phosphoric ester group, cyano, an aromatic group, a heterocyclic group, —O—R, —S—R, —CO—R, —NH—R, —N(—R)$_2$, —N$^+$(—R)$_3$, —CO—O—R, —O—CO—R, —CO—NH—R, —NH—CO—R and —P(=O)(—O—R)$_2$. R is an aliphatic group, an aromatic group or a heterocyclic group. Carboxyl, sulfo, the sulfonic ester group, phosphono and the phosphoric ester group can be dissociated to release a hydrogen atom (proton) or can be in the form of a salt.

The aromatic group preferably has 6 to 20 carbon atoms, more preferably has 6 to 15 carbon atoms, and most preferably has 6 to 10 carbon atoms.

The aromatic group can have a substituent group. Examples of the substituent groups include a halogen atom (F, Cl, Br, I), amino, hydroxyl, mercapto, carboxyl, sulfo, a sulfonic ester group (—$SO_2$—O—R or —O—$SO_2$—R), phosphono, a phosphoric ester group, cyano, an aliphatic group, an aromatic group, a heterocyclic group, —O—R, —S—R, —CO—R, —NH—R, —N(—R)$_2$, —N$^+$(—R)$_3$, —CO—O—R, —O—CO—R, —CO—NH—R, —NH—CO—R and —P(=O)(—O—R)$_2$. R is an aliphatic group, an aromatic group or a heterocyclic group. Carboxyl, sulfo, the sulfonic ester group, phosphono and the phosphoric ester group can be dissociated to release a hydrogen atom (proton) or can be in the form of a salt.

The heterocyclic group preferably has 1 to 20 carbon atoms, more preferably has 1 to 15 carbon atoms, further preferably has 1 to 10 carbon atoms, furthermore preferably has 1 to 8 carbon atoms, and most preferably has 1 to 6 carbon atoms.

The heterocyclic group can have a substituent group. Examples of the substituent groups are the same as the substituent groups of the aromatic group.

Examples of the polyols having sulfonic ester bonds are shown below.
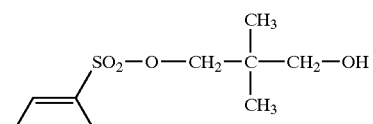 (51)
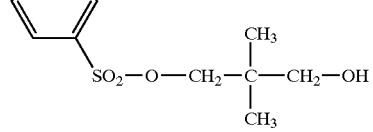 (52)
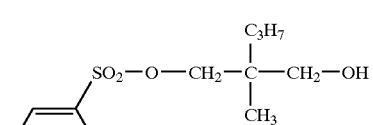 (53)
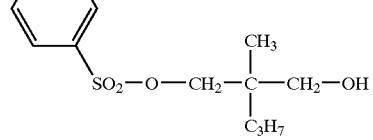 (54)
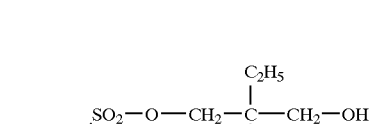 (55)
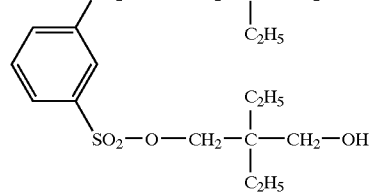 (56)
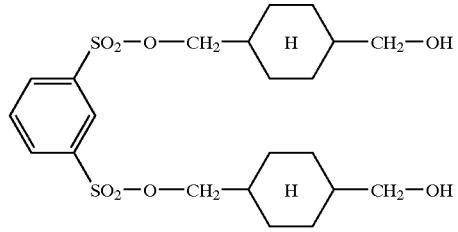 (57)
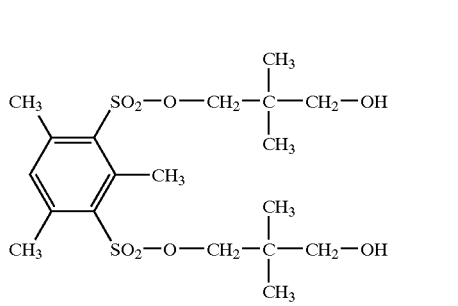 (58)
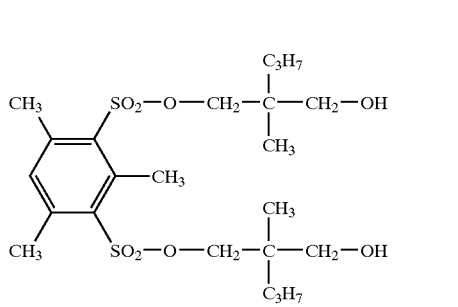 (59)
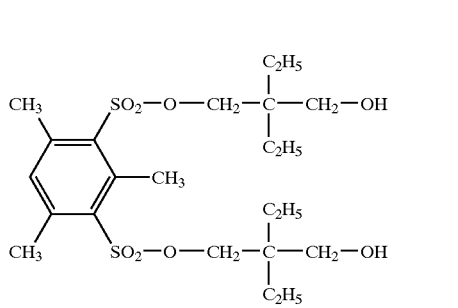 (60)
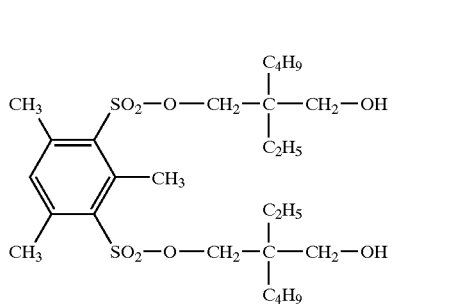 (61)
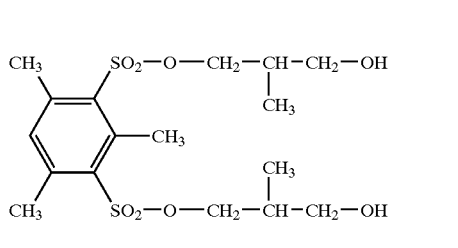 (62)

(63)
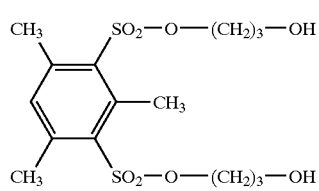
(64)
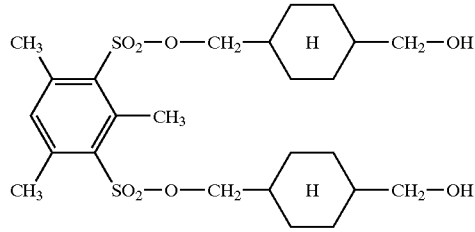
(65)
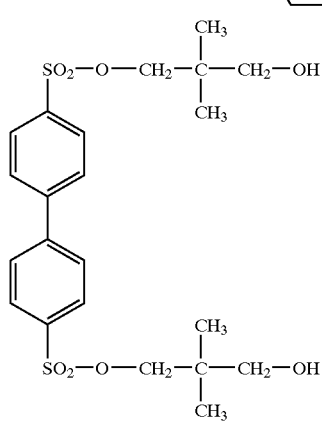
(66)
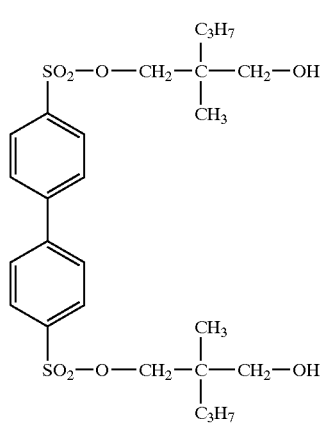
(67)
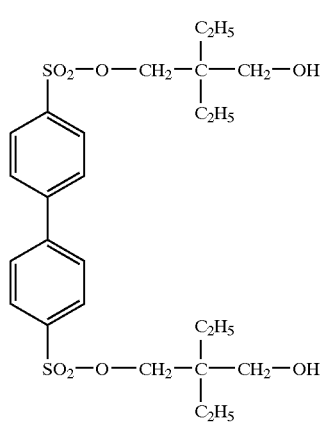
(68)
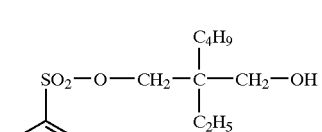
(69)
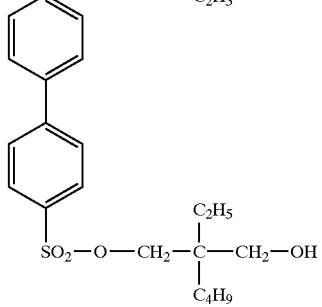
(70)
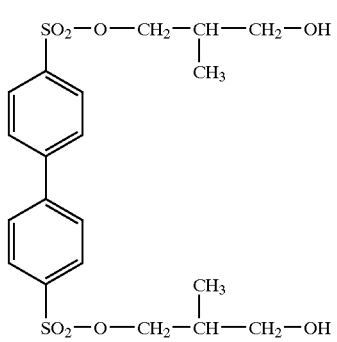
(71)
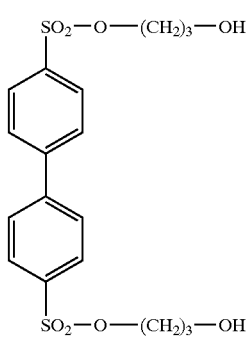

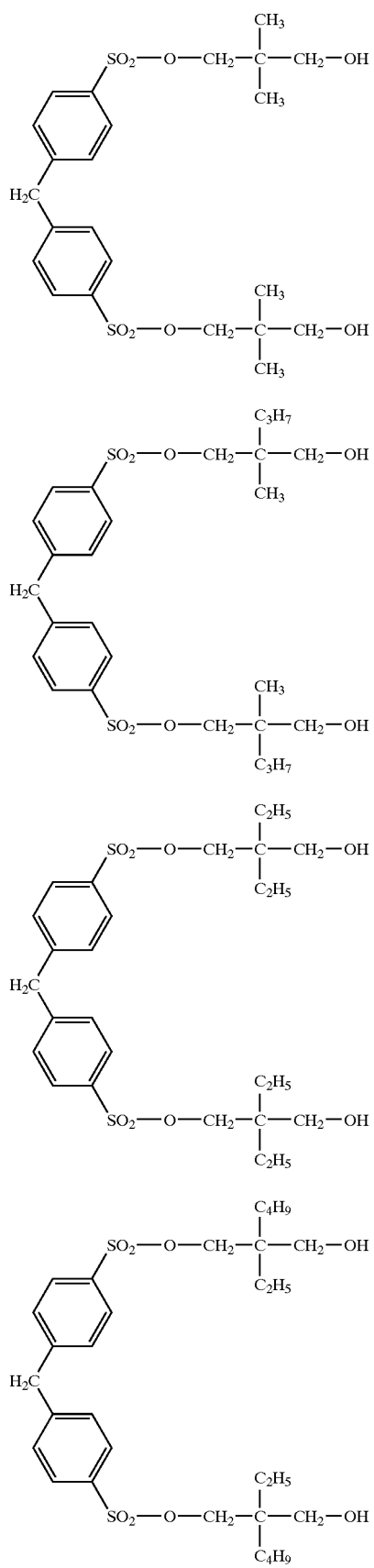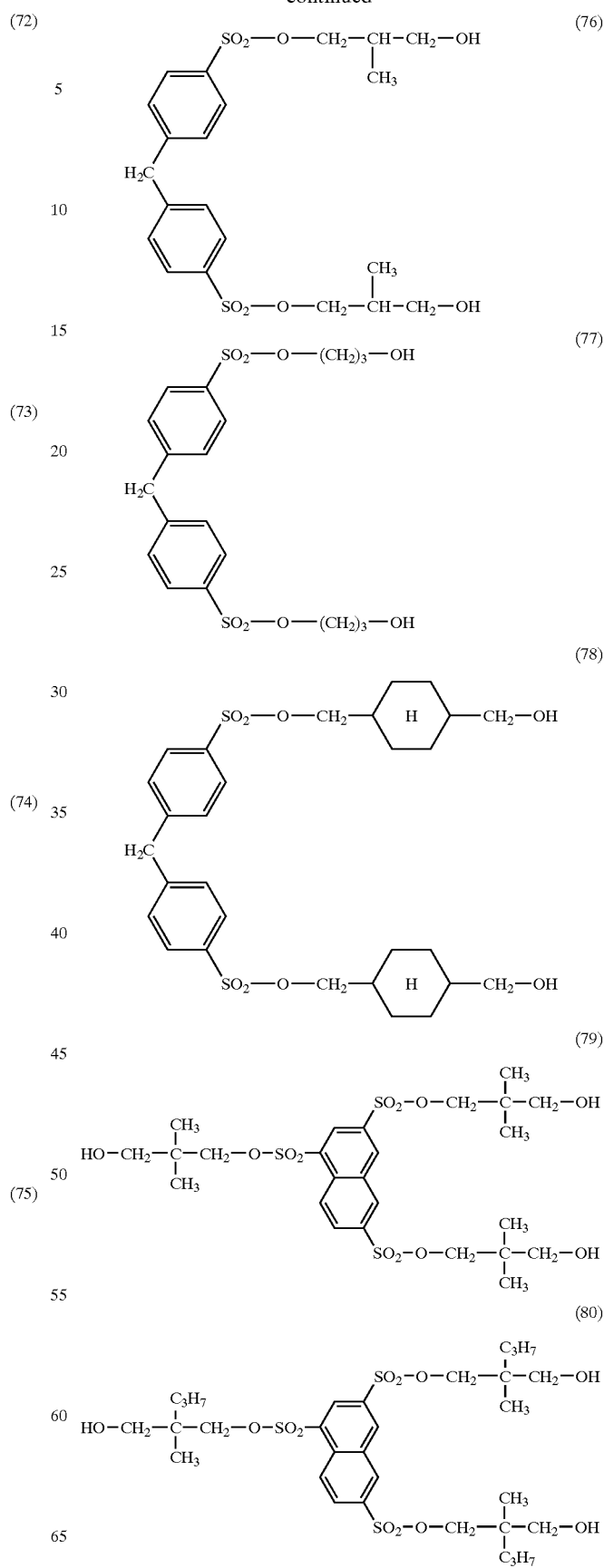

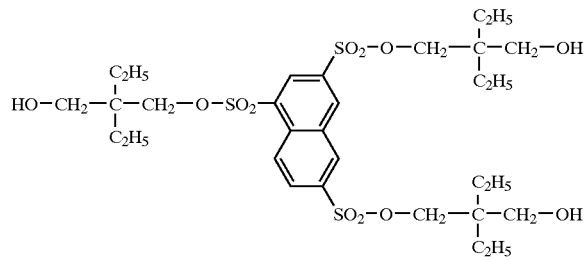

(81)

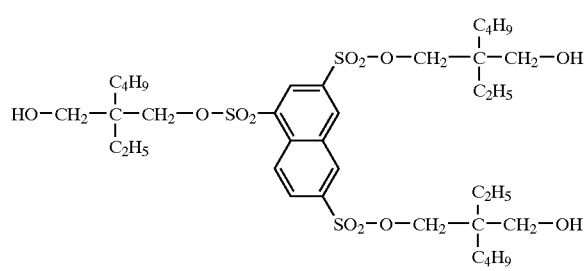

(82)

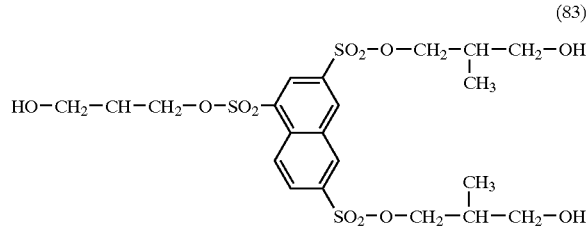

(83)

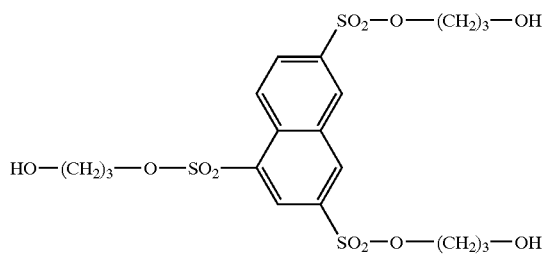

(84)

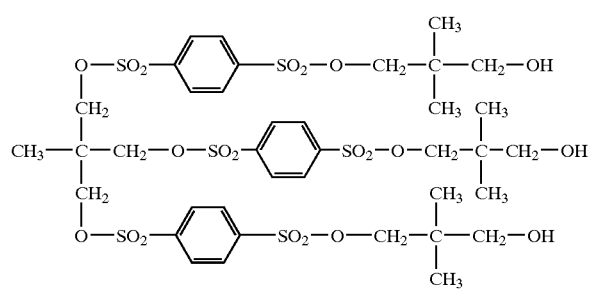

(85)

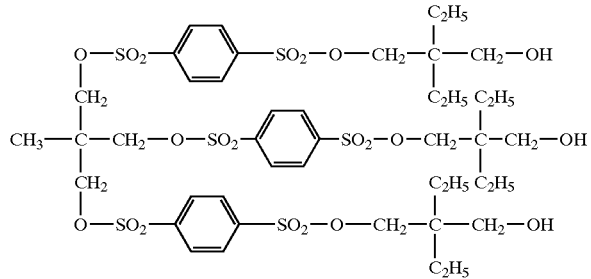

(86)

Two or more polyols can be used in combination.

The polyisocyanate preferably is a diisocyanate, and more preferably is a diisocyanate represented by the formula (III).

OCN-L$^4$-NCO  (III)

In the formula (III), $L^4$ is a divalent linking group. $L^4$ preferably is a divalent linking group selected from the group consisting of an alkylene group, a substituted alkylene group, an arylene group, a substituted arylene group and a combination thereof, and more preferably is a divalent linking group comprising an alkylene group and an arylene group.

Examples of the substituent groups of the substituted alkylene groups include a halogen atom (F, Cl, Br, I), oxo (=O), thio (=S), an aryl group, a substituted aryl group and an alkoxy group.

The arylene group preferably is phenylene and more preferably is p-phenylene.

Examples of the substituent groups of the substituted arylene groups and the substituted aryl groups include a halogen atom (F, Cl, Br, I), an alkyl group, a substituted alkyl group, an aryl group, a substituted aryl group and an alkoxy group.

Examples of the substituent groups of the substituted alkyl groups are the same as the substituent groups of the substituted alkylene groups.

Examples of the diisocyanates include a xylylene diisocyanate (e.g., m-xylylene diisocyanate, p-xylylene diisocyanate), 4-chloro-m-xylylene diisocyanate, 2-methyl-m-xylylene diisocyanate, a phenylene diisocyanate (e.g., m-phenylene diisocyanate, p-phenylene diisocyanate), a toluylene diisocyanate (e.g., 2,6-toluylene diisocyanate, 2,4-toluylene diisocyanate), a naphthalene diisocyanate (e.g., naphthalene-1,4-diisocyanate), isophorone diisocyanate, an alkylene diisocyanate (e.g., trimethylene diisocyanate, hexamethylene diisocyanate, propylene-1,2-diisocyanate, butylene-1,2-diisocyanate, cyclohexylene-1,2-diisocyanate, cyclohexylene-1,3-diisocyanate, cyclohexylene-1,4-diisocyanate, dicyclohexylmethane-1,4-diisocyanate, 1,4-bis(isocyanatomethyl)cyclohexane, 1,3-bis(isocyanatomethyl)cyclohexane), diphenylmethane-4,4'-diisocyanate, 3,3'-dimethoxybiphenyl diisocyanate, 3,3'-dimethyldiphenylmethane-4,4'-diisocyanate, 4,4'-diphenylpropane diisocyanate, 4,4'-diphenylhexafluoropropane diisocyanate and lysine diisocyanate.

The xylylene diisocyanate and the toluylene diisocyanate are preferred, the xylylene diisocyanate is more preferred, and m-xylylene diisocyanate is most preferred.

Two or more diisocyanates can be used in combination.

A polyol is preferably reacted with a polyisocyanate to form an adduct as an intermediate (or a prepolymer), which is preferably reacted to synthesize a shell polymer.

In a reaction of synthesizing the adduct, the mass ratio of polyol/polyisocyanate is preferably in the range of 1/100 to 80/100, and more preferably in the range of 5/100 to 50/100.

The polyol and the polyisocyanate can be reacted by heating a mixture of them in an organic solvent. In the case that a catalyst is not used, the heating temperature is preferably in the range of 50 to 100° C. In the case that a catalyst is used, the reaction can proceed at a relatively low temperature (40 to 70° C.). Examples of the catalysts include tin(II) octylate and dibutyl tin diacetate.

The organic solvent is a liquid that does not contain an active hydrogen (namely a liquid that is neither an alcohol, a phenol nor an amine). Examples of the organic solvents include an ester (e.g., ethyl acetate), a halogenated hydrocarbon (e.g., chloroform), an ether (tetrahydrofuran), a ketone (e.g., acetone), nitrile (e.g., acetonitrile) and a hydrocarbon (e.g., toluene).

Two or more adducts can be used in combination. For example, an adduct of a polyol containing a sulfonic ester bond and a polyisocyanate can be used in combination with an adduct of another polyol and a polyisocyanate or another polyisocyanate. The polyol containing a sulfonic ester bond is preferably used in an amount of not less than 10 wt. % based on the total amount of the basic materials of the shell polymer. In the case that an adduct of an adduct of a polyol containing a sulfonic ester bond and a polyisocyanate is used in combination with another adduct, the amount of the adduct containing the sulfonic ester bond is preferably in an amount of 5 to 80 wt. %, and more preferably in an amount of 10 to 50 wt. % based on the total amounts of the adducts.

A polyamine can be used in combination with the polyol and the polyisocyanate. The polyamine preferably is soluble in water. Examples of the polyamines include ethylene diamine, propylene diamine, diethylene triamine, trimethylene tetramine and tetramethylene pentamine.

[Core of Microcapsules]

A core of microcapsules comprises a polymerizable compound. The polymerizable compound can be in the form of a polymer, which is a cross-linkable polymer having a polymerizable group as a cross-likable functional group.

The polymerizable compound preferably has two or more polymerizable functional groups.

The polymerizable functional group can be reacted by heat to be polymerized. A heat-sensitive precursor of accelerating the polymerization reaction (e.g., acid) can be used in combination with a polymerizable compound (e.g., a vinyl ether or a cyclic ether). Further, a thermal polymerization initiator (a radical precursor) can be used in combination with a polymerizable compound (ethylenically unsaturated polymerizable compound).

The combination of the heat-sensitive acid precursor and the vinyl ether or the cyclic ether is described in Japanese Patent Provisional Publication No. 2001-277740, 2002-46361 and 2002-29162.

The combination of the thermal polymerization initiator (the radical precursor) and the ethylenically unsaturated polymerizable compound is described in Japanese Patent Provisional Publication No. 2002-137562.

The cyclic ether preferably is a compound having a three-membered epoxy group. The compound preferably has two or more cyclic ether groups. A commercially available epoxy compound or epoxy resin can be used as the polymerizable compound.

The vinyl ether preferably has two or more vinyl ether groups. The vinyl ether is preferably represented by the formula (IV).

(IV)

In the formula (IV), $L^5$ is a p-valent linking group, and p is an integer of 2 or more. Each of $R^1$, $R^2$ and $R^3$ independently is hydrogen, a halogen atom, an alkyl group or an aryl group.

In the case that p is 2, $L^5$ preferably is a divalent linking group selected from the group consisting of an alkylene group, a substituted alkylene group, an arylene group, a substituted arylene group, a divalent heterocyclic group, —O—, —S—, —NH—, —CO—, —SO—, —SO$_2$— and a combination thereof.

The alkylene group and the alkylene moiety of the substituted alkylene group can have a cyclic or branched structure. The alkylene group and the alkylene moiety of the substituted alkylene group preferably have 1 to 20 carbon atoms, more preferably has 1 to 15 carbon atoms, further preferably has 1 to 10 carbon atoms, and most preferably has 1 to 8 carbon atoms.

Examples of the substituent groups of the substituted alkylene group include a halogen atom, an aryl group, a substituted aryl group and an alkoxy group.

The arylene group and the arylene moiety of the substituted arylene group preferably is phenylene, and more preferably is p-phenylene.

The divalent heterocyclic group can have a substituent group.

Examples of the substituent groups of the substituted arylene group, the substituted aryl group and the substituted heterocyclic group include a halogen atom, an alkyl group, a substituted alkyl group, an aryl group, a substituted aryl group and an alkoxy group.

Examples of the substituent groups of the substituted alkyl group are the same as the examples of the substituent groups of the substituted alkylene group.

In the case the p is 3 or more, $L^5$ preferably is a trivalent or more aliphatic group, a trivalent or more aromatic group, a trivalent or more heterocyclic group, or a combination of a trivalent or more aliphatic group, a trivalent or more aromatic group or a trivalent or more heterocyclic group with an alkylene group, a substituted alkylene group, an arylene group, a substituted arylene group, a divalent heterocyclic group, —O—, —S—, —NH—, —CO—, —SO— or —SO$_2$—.

The trivalent or more aliphatic group can have a cyclic or branched structure. The aliphatic preferably has 1 to 20 carbon atoms, more preferably has 1 to 15 carbon atoms, further preferably has 1 to 10 carbon atoms, and most preferably has 1 to 8 carbon atoms.

The aliphatic group can have a substituent group. Examples of the substituent groups include a halogen atom, an aryl group, a substituted aryl group and an alkoxy group.

The aromatic group preferably is a residue (a radical) of benzene ring. The aromatic group can have a substituent group. Examples of the substituent groups include a halogen atom, an alkyl group, a substituted alkyl group, an aryl group, a substituted aryl group and an alkoxy group.

The heterocyclic group can have a substituent group. Examples of the substituent groups include a halogen atom, an alkyl group, a substituted alkyl group, an aryl group, a substituted aryl group and an alkoxy group.

$L^5$ can form a main chain of a polymer comprising repeating units, in which p is a number of the repeating units.

Each of $R^1$, $R^2$ and $R^3$ preferably is hydrogen, a halogen atom or an alkyl group, more preferably is hydrogen, a halogen atom or an alkyl group having 1 to 6 carbon atoms, further preferably is hydrogen or an alkyl group having 1 to 3 carbon atoms, furthermore preferably is hydrogen or methyl, and most preferably is hydrogen.

The ethylenically unsaturated polymerizable compound preferably has two or more ethylenically unsaturated groups. The ethylenically unsaturated polymerizable compound is preferably represented by the formula (V).

$$L^5(-CR^1=CR^2R^3)_p \qquad (V)$$

In the formula (V), $L^5$ is a p-valent linking group, and p is an integer of 2 or more. Each of $R^1$, $R^2$ and $R^3$ independently is hydrogen, a halogen atom, an alkyl group or an aryl group.

The definitions and examples of $L^5$, p, $R^1$, $R^2$ and $R^3$ are the same as $L^5$, p, $R^1$, $R^2$ and $R^3$ in the formula (IV).

The core of the microcapsules can comprise an agent of accelerating thermal polymerization (e.g., heat-sensitive acid precursor), a thermal polymerization initiator, an agent of converting light to heat in addition to the polymerizable compound.

[Heat-Sensitive Acid Precursor]

In the case that a polymerizable compound has a functional group for a cationic polymerization reaction (such as a vinyl ether or a cyclic ether), the image-forming layer preferably further comprises a heat-sensitive acid precursor.

The heat-sensitive acid precursor is a compound capable of releasing an acid when the compound is heated. The formed acid can initiate or accelerate a polymerization reaction of a vinyl ether or a cyclic ether.

The heat-sensitive acid precursor can be added to the image-forming layer, and is preferably added to the microcapsules. The heat-sensitive acid precursor preferably is an onium salt.

In the case that the shell polymer contains a sulfonic ester bond, the sulfonic ester bond is decomposed while heating to release a sulfonic acid, which can accelerate a thermal polymerization. In other words, the sulfonic ester bond contained in the shell polymer can function as a heat-sensitive acid precursor.

Examples of the heat-sensitive acid precursors include a diazonium salt (described in S. I. Schlesinger, Photogr. Sci. Eng., 18, 387 (1974), and T. S. Bal et al, Polymer, 21, 423 (1980)), an ammonium salt (described in U.S. Pat. Nos. 4,069,055, 4,069,056, Reissued U.S. Pat. No. 27,992 and Japanese Patent Provisional Publication No. 4(1992)-365049), a phosphonium salt (described in D. C. Necker et al, Macromolecules, 17, 2468 (1984), C. S. Wen et al, Teh, Proc. Conf. Rad, Curing ASIA, p478 Tokyo, October (1988), U.S. Pat. Nos. 4,069,055 and 4,069,056), an iodonium salt (described in J. V. Crivello et al, Macromorecules, 10(6), 1307 (1977), Chem. & Eng. News, November 28, p31 (1988), European Patent No. 104142, U.S. Pat. Nos. 4,339, 049, 4,410,201, and Japanese Patent Provisional Publication Nos. 2(1990)-150848 and 2(1990)-296514), a sulfonium salt (J. V. Crivello et al, Polymer J. 17, 73 (1985), J. V. Crivello et al, J. Org. Chem., 43, 3055 (1978), W. R. Watt et al, J. Polymer Sci., Polymer Chem. Ed., 22, 1789 (1984), J. V. Crivello et al, Polymer Bull., 14, 279 (1985), J. V. Crivello et al, Macromolecules, 14(5), 1141 (1981), J. V. Crivello et al, J. Polymer Sci., Polymer Chem. Ed., 17, 2877 (1979), European Patent Nos. 370693, 390214, 233567, 297443, 297442, U.S. Pat. Nos. 4,933,377, 4,161,811, 4,410,201, 4,339,049, 4,760,013, 4,734,444, 2,833,827, German Paten Nos. 2,904,626, 3,604,580 and 3,604,581), a selenonium salt (described in J. V. Crivello et al, Macromolecules, 10(6), 1307 (1977), J. V. Crivello et al, J. Polymer Sci., Polymer Chem. Ed., 17, 1047 (1979) and an arsonium salt (described in C. S. Wen et al, Teh, Proc. Conf. Rad. Curing ASIA, p478 Tokyo, October (1988)).

Examples of counter anions of the onium salts include $BF_4^-$, $PF_6^-$, $AsF_6^-$ and $SbF_6^-$.

Two or more heat-sensitive acid precursors can be used in combination.

The heat-sensitive acid precursor is used preferably in an amount of 0.01 to 20 wt. %, and more preferably in an amount of 0.1 to 10 wt. % based on the total solid amount of the image-forming layer.

The heat-sensitive acid precursor can be contained in microcapsules. In the case that the heat-sensitive acid precursor is contained in the microcapsules, the heat-sensitive acid precursor is preferably not soluble in water. In the case that the heat-sensitive acid precursor is arranged outside the microcapsules, the heat-sensitive acid precursor is preferably soluble in water.

[Thermal Polymerization Initiator]

In the case that a polymerizable compound has a functional group for a radical polymerization reaction (such as an ethylenically unsaturated polymerizable compound), the image-forming layer preferably further comprises a thermal polymerization initiator.

The thermal polymerization initiator is a compound that releases a radical by a thermal energy to initiate or accelerate a polymerization of a compound having an unsaturated polymerizable group. Examples of the thermal polymerization initiators include an onium salt, a triazine compound having a trihalomethyl group, a peroxide, an azo compound, an azido compound, a quinone diazido compound and a metallocene compound. An onium salt (e.g., diazonium salt, iodonium salt, sulfonium salt, ammonium salt, pyridinium salt) is preferred, an iodonium salt, a diazonium salt and a sulfonium salt are more preferred.

Two or more thermal polymerization initiators can be used in combination.

The thermal polymerization initiator (thermal radical precursor) is described in Japanese Patent Provisional Publication No. 2002-137562.

The thermal polymerization initiator is used preferably in an amount of 0.1 to 50 wt. %, and more preferably in an amount of 0.5 to 30 wt. %, and most preferably in an amount of 1 to 20 wt. % based on the total solid amount of the image-forming layer.

The thermal polymerization initiator can be contained in microcapsules. In the case that the thermal polymerization initiator is contained in the microcapsules, the thermal polymerization initiator is preferably not soluble in water. In the case that the thermal polymerization initiator is arranged outside the microcapsules, the thermal polymerization initiator is preferably soluble in water.

[Preparation of Microcapsules]

The microcapsules can be prepared according to known methods, which include a coacervation method (described in U.S. Pat. Nos. 2,800,457 and 2,800,458), an interfacial polymerization method (described in British Patent No. 990,443, U.S. Pat. No. 3,287,154, Japanese Patent Publication Nos. 38(1963)-19574, 42(1967)-446 and 42(1967)-711), a polymer deposition method (described in U.S. Pat. Nos. 3,418,250, 3,660,304), an isocyanate/polyol wall formation method (described in U.S. Pat. No. 3,796,669), an isocyanate wall formation method (described in U.S. Pat. No. 3,914,511), a urea/formaldehyde or urea/formaldehyde-resorcinol wall formation method (described in U.S. Pat. Nos. 4,001,140, 4,087,376, 4,089,802), a melamine-formaldehyde or hydroxyalkyl cellulose wall formation method (described in U.S. Pat. No. 4,025,445), an in situ method with a monomer polymerization (described in Japanese Patent Publication Nos. 36(1961)-9163, 51(1976)-9079), a spry-drying method (described in British Patent No. 930,422, U.S. Pat. No. 3,111,407) and an electrolytic dispersion cooling method (described in British Patent Nos. 952,807 and 967,074).

The microcapsules have a mean particle size preferably in the range of 0.01 to 20 µm, more preferably in the range of 0.05 to 2.0 µm, and most preferably in the range of 0.10 to 1.0 µm.

Two or more kinds of microcapsules can be used in combination.

The amount of the microcapsules contained in the image-forming layer is preferably in the range of 10 to 95 wt. %, and more preferably in the range of 15 to 90 wt. % in terms of solid content.

[Hydrophilic Polymer]

The image-forming layer preferably contains a hydrophilic polymer. The hydrophilic polymer preferably functions as a binder of microcapsules. The hydrophilic polymer can also function as a protective colloid in preparation of the microcapsules.

The hydrophilic polymer preferably has hydroxyl, carboxyl or amino as a hydrophilic group. Carboxyl can be in the form of salt.

Various natural, semi-synthetic or synthetic polymers can be used as the hydrophilic polymer.

Examples of the natural or semi-synthetic polymers include polysaccharides (e.g., gum arabic, starch derivatives, carboxymethyl cellulose, sodium salt thereof, cellulose acetate, sodium alginate) and proteins (e.g., casein, gelatin).

Examples of the synthetic polymers having hydroxyl as the hydrophilic group include polyhydroxyethyl methacrylate, polyhydroxyethyl acrylate, polyhydroxypropyl methacrylate, polyhydroxypropyl acrylate, polyhydroxybutyl methacrylate, polyhydroxybutyl acrylate, polyallylalcohol, polyvinylalcohol and poly-N-methylolacrylamide.

Examples of the synthetic polymers having carboxyl as the hydrophilic group include polymaleic acid, polyacrylic acid, polymethacrylic acid and salts thereof.

Examples of the synthetic polymers having other hydrophilic groups (e.g., amino, many ether bonds, hydrophilic heterocyclic groups, amido bond, sulfo) include polyethylene glycol, polyvinyl formal, polyvinyl butyral, polyvinylpyrrolidone, polyacrylamide, polymethacrylamide, poly(2-acrylamido-2-methylpropanesuldonic acid) and a salt thereof.

The hydrophilic polymer can have an ethylenically unsaturated group in its side chain. The definition and examples of the ethylenically unsaturated groups are the same as the ethylenically unsaturated groups of the polymerizable compounds.

The hydrophilic polymer can be a copolymer comprising two or more hydrophilic repeating units of the above-mentioned hydrophilic synthetic polymers. The hydrophilic polymer can also be a copolymer comprising the hydrophilic repeating unit and a hydrophobic repeating unit (for example, repeating units of polyvinyl acetate or polystyrene).

Examples of the copolymers include vinyl acetate-maleic acid copolymer, styrene-maleic acid copolymer and vinyl alcohol-vinyl acetate copolymer (partially saponified polyvinyl acetate). In the case where polyvinylacetate is partially saponified into the vinyl alcohol-vinyl acetate copolymer, the saponification degree preferably is not less than 60%, and more preferably is not less than 80%.

The hydrophilic polymer preferably is gum arabic, carboxymethyl cellulose, polyacrylic acid, polymethacrylic acid, polyacrylamide, polymethacrylamide, poly(2-acrylamido-2-methylpropanesuldonic acid) or a polyvinyl alcohol having a saponification degree of not less than 60%, more preferably is carboxymethyl cellulose, polyacrylic acid, polymethacrylic acid, polyacrylamide or polymethacrylamide.

Two or more hydrophilic polymers can be used in combination.

The hydrophilic polymer can have a cross-linked structure. The cross-linked structure can be introduced into the hydrophilic polymer by using a cross-linking agent. Examples of the cross-linking agents include an aldehyde (e.g., glyoxal), an aldehyde resin (e.g., melamine-formaldehyde resin, urea-formaldehyde resin), a methylol compound (e.g., N-methylol urea, N-methylol melamine, methylol polyamide resin), an active vinyl compound (e.g., divinylsulfone, bis(β-hydroxyethylsulfonic acid), an epoxy compound (e.g., epichlorohydrin, polyethylene glycol diglycidyl ether, polyamine-polyamide epichlorohydrin adduct, polyamide epichlorohydrin resin), an ester (e.g., monochloroacetic ester, thioglycolic ester), a polycarboxylic acid (e.g., polyacrylic acid, methyl vinyl ether/maleic acid copolymer), an inorganic acid (e.g., boric acid), titanyl sulfate, a metal salt (e.g., copper salt, aluminum salt, tin salt, vanadium salt, chromium salt) and a denatured polyamide polyimide resin. A cross-linking catalyst (e.g., ammonium chloride, silane coupling agent, titanate coupling agent) can be used in combination with the cross-linking agent.

The image-forming layer contains the hydrophilic polymer preferably in an amount of 2 to 40 wt. %, and more preferably in an amount of 3 to 30 wt. %.

[Agent Capable of Converting Light to Heat]

The image-forming layer or an optionally formed layer preferably contains an agent capable of converting light to heat. The agent capable of converting light to heat is preferably contained in the image-forming layer, and more preferably contained in microcapsules.

The converting agent absorbs light and converts the energy of light into thermal energy to generate heat.

The agent preferably absorbs light having the maximum absorption in the wavelength region of 700 nm or longer (infrared light). An infrared absorbing pigment, an infrared absorbing dye and metal fine particles are preferably used as the converting agent.

The infrared absorbing pigments are described in "Handbook of Color Index (CI)", "Latest Handbook of pigments (written in Japanese)", 1977, edited by Japan Association of Pigment Technology, "Latest Application Technology of Pigment (written in Japanese)", 1986, published by CMC, and "Technology of Printing Ink (written in Japanese)", 1984, published by CMC.

Carbon black is the most preferred infrared absorbing pigment.

In the case where the infrared absorbing pigment is contained in microcapsules, the pigment can be subjected to a hydrophobic (oleophilic) treatment. For example, a surface of the pigment can be coated with an oleophilic resin.

In the case where the infrared absorbing pigment is dispersed in a hydrophilic polymer, the pigment can be subjected to a hydrophilic treatment. For example, a surface of the pigment can be coated with a hydrophilic resin. A surface active agent can be adsorbed onto the pigment surface to form a hydrophilic surface. A reactive hydrophilic substance (e.g., silica sol, alumina sol, a silane coupling agent, an epoxy compounds, an isocyanate compound) can be combined with the pigment to form a hydrophilic surface.

The pigment has a particle size preferably in the range of 0.01 to 1 µm, and more preferably in the range of 0.01 to 0.5 µm.

The pigment particles can be dispersed in the hydrophilic polymer according to a conventional dispersing method for producing printing ink or toner.

The infrared absorbing dyes are described in "Handbook of Dyes (written in Japanese)", 1970, edited by Association of Organic Synthetic Chemistry, "Chemical Industry (written in Japanese)", May 1986, pp.45–51, the article titled "Near Infrared Absorbing Dyes", and "Development and Market of functional dyes in 1990", 1990, Chapter 2, Sections 2 and 3, published by CMC.

Examples of the infrared absorbing dyes include azo dyes, metal complex salt azo dyes, pyrazolone azo dyes, naphthoquinone dyes (described in Japanese Patent Provisional Publication Nos. 58(1983)-12793, 58(1983)-224793, 59(1984)-48187, 59(1984)-73996, 60(1985)-52940 and 60(1985)-63744), anthraquinone dyes, phthalocyanine dyes (described in Japanese Patent Provisional Publication No. 11(1999)-235883), squarilium dyes (described in Japanese Patent Provisional Publication No. 58(1983)-112792), pyrylium dyes (U.S. Pat. Nos. 3,881,924, 4,283,475, Japanese Patent Provisional Publication Nos. 57(1982)-142645, 58(1983)-181051, 58(1983)-220143, 59(1984)-41363, 59(1984)-84248, 59(1984)-84249, 59(1984)-146063, 59(1984)-146061, Japanese Patent Publication Nos. 5(1993)-13514 and 5(1993)-19702), carbonium dyes, quinoneimine dyes and methine dyes (described in Japanese Patent Provisional Publication Nos. 58(1983)-173696, 58(1983)-181690 and 58(1983)-194595).

The infrared absorbing dye is also described in U.S. Pat. Nos. 4,756,993, 5,156,938 and Japanese Patent Provisional Publication No. 10(1998)-268512.

The commercially available infrared absorbing dyes (e.g., Epolight III-178, III-130, III-125, EPOLINE) can also be used in the present invention.

Methine dyes are preferred. Cyanine dyes (described in British Patent No. 434,875, U.S. Pat. No. 4,973,572, Japanese Patent Provisional Publication Nos. 58(1983)-125246, 59(1984)-84356, 59(1984)-216146 and 60(1985)-78787) are more preferred. The cyanine dye is defined by the following formula.

$$Bo\text{-}Lo=Bs \qquad \text{(Cyanine dye)}$$

In the formula, Bs is a basic nucleus, Bo is an onium form of a basic nucleus, and Lo is a methine chain consisting of an odd number of methines. In the infrared absorbing methine dye, Lo preferably is a methine chain consisting of seven methines.

A hydrophilic dye is preferably used in the case where the infrared absorbing dye is added in a hydrophilic polymer of an image-forming layer. A relatively hydrophobic dye is preferably used in the case where the infrared absorbing dye is incorporated into microcapsules.

Metals generally have self-exothermic property. Accordingly, metals absorbing infrared, visible or ultraviolet (particularly, infrared) light is capable of converting light to heat.

The metal used in the form of fine particles is preferably melted and agglomerated by heat. The metal preferably has a melting point of 1,000° C. or below.

Examples of the metals forming the fine particles include Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re, Sb and alloys thereof. Re, Sb, Te, Ag, Au, Cu, Ge, Pb and Sn are preferred, Ag, Au, Cu, Sb, Ge and Pb are more preferred, and Ag, Au and Cu are most preferred.

Alloys of metals can comprise a metal having low melting point (e.g., Re, Sb, Te, Au, Ag, Cu, Ge, Pb, Sn) and a highly self-exothermic metal (e.g., Ti, Cr, Fe, Co, Ni, W, Ge). Fine particles of metals highly absorbing light (e.g., Ag, Pt, Pb) can be used in combination with fine particles of other metals.

The metal fine particles are preferably subjected to a hydrophilic surface treatment, and dispersed in a hydrophilic polymer. Examples of the hydrophilic surface treatments include a surface treatment with hydrophilic material (e.g., surface active agent), a surface chemical reaction with hydrophilic material and a formation of (protective colloidal) hydrophilic polymer coating film. The surface chemical reaction with hydrophilic material is preferred, and a surface silicate treatment is most preferred. In the surface silicate treatment for iron fine particles, the particles are immersed in 3 wt. % aqueous solution of sodium silicate at 70° C. for 30 seconds to form a hydrophilic surface on the particles. The fine particles of other metals can also be subjected to the surface silicate treatment in a similar manner.

Fine particles of metal oxides or metal sulfides can be used in place of the metal fine particles.

The fine particles have sizes preferably of not more than 10 $\mu$m, more preferably in the range of 0.003 to 5 $\mu$m, and most preferably in the range of 0.01 to 3 $\mu$m.

[Other Optional Components in Image-forming Layer]

The image-forming layer may contain a colorant. The imaging area containing the colorant can be easily distinguished from the non-imaging area after the image is formed. The colorant is a dye or pigment having a large absorption band within the visible region. Examples of the colorants include Oil Yellow #101, Oil Yellow #103, Oil Pink #312, Oil Green BG, Oil Blue BOS, Oil Blue #603, Oil Black BY, Oil Black BS and Oil Black T-505 (from Orient Chemical Industries Co., ltd); Victoria Pure Blue, Crystal Violet (CI42555), Methyl Violet (CI42535), Ethyl Violet, Rhodamine B (CI145170B), Malachite Green (CI42000) and Methylene Blue (CI52015). Dyes usable as the colorant are described in Japanese Patent Provisional Publication No. 62(1987)-293247. Further, inorganic pigments such as titanium oxide can be also used as the colorant.

The amount of the colorant is preferably in the range of 0.01 to 10 wt. % based on the amount of the image-forming layer.

The image-forming layer may contain a nonionic surface active agent (described in Japanese Patent Provisional Publication Nos. 62(1987)-251740 and 3(1991)-208514) or an amphoteric surface active agent (described in Japanese Patent Provisional Publication Nos. 59(1984)-121044 and 4(1992)-13149) to improve stability for on-press development.

Examples of the nonionic surface active agents include sorbitan tristearate, sorbitan monopalmitate, sorbitan trioleate, stearic monoglyceride and polyoxyethylene noneylphenyl ether. Examples of the amphoteric surface active agents include an alkyldi(aminoethyl)glycine, a hydrochloric salt of an alkylpolyaminoethylglycine, an 2-alkyl-N-carboxyethyl-N-hydroxyethylimidazoliniumbetaine and an N-tetradecyl-N,N-betaine type surface active agent (Amorgen K, Dai-ichi Kogyo Co., Ltd.).

The amount of the nonionic or amphoteric surface active agent is preferably in the range of 0.05 to 15 wt. %, and more preferably in the range of 0.1 to 5 wt. % based on the amount of the image-forming layer.

A plasticizer can be added to make the image-forming layer flexible. Examples of the plasticizers include polyethylene glycol, tributyl citrate, diethyl phthalate, dibutyl phthalate, dihexyl phthalate, dioctyl phthalate, tricredyl phosphate, tributyl phosphate, trioctyl phosphate and tetrahydrofurfuryl oleate.

[Formation of Image-forming Layer]

The image-forming layer can be formed by the steps of dissolving, dispersing or emulsifying microcapsules and other components in an appropriate solvent to prepare a coating solution, coating the solution on a support, and drying it to remove the solvent.

Examples of the solvents include ethylene dichloride, cyclohexane, methyl ethyl ketone, methanol, ethanol, propanol, ethylene glycol monomethyl ether, 1-methoxy-2-propanol, 2-methoxyethyl acetate, 1-methoxy-2-propylacetate, dimethoxyethane, methyl lactate, ethyl lactate, N,N-dimethylacetamide, N,N-dimethylformamide, tetrametnylurea, N-methylpyrrolidone, dimethyl sulfoxide, sulfolane, γ-butyllactone, toluene and water. Two or more solvents can be used in combination.

The solid content in the coating solution is preferably in the range of 1 to 50 wt. %.

The coating solution can contain a surface active agent to be easily applied on the support. The surface active agent preferably is a fluorine-containing surface active agent (described in Japanese Patent Provisional Publication No. 62(1987)-170950). The amount of the surface active agent is preferably in the range of 0.01 to 1 wt. %, more preferably in the range of 0.05 to 0.5 wt. % based on the solid content.

The dry coating amount of the image-forming layer is preferably in the range of 0.5 to 5.0 g/m$^2$.

[Hydrophilic Support]

The hydrophilic support can be a metal plate, a plastic film or paper. The support preferably is a surface-treated aluminum plate, a hydrophilic treated plastic film or a water-proofed paper. The support more preferably is an aluminum plate subjected to anodic oxidation, a polyethylene terephthalate film provided with a hydrophilic layer and a paper laminated with a polyethylene film.

The aluminum plate subjected to anodic oxidation is particularly preferred.

The aluminum plate can be a plate of pure aluminum, or an alloy plate comprising the main component of aluminum and a trace amount of other metals. Examples of the metals other than aluminum include Si, Fe, Mn, Co, Mg, Cr, Zn, Bi, Ni and Ti. The amount of the other metals is preferably 10 wt. % or less. An aluminum plate for printing plate is commercially available.

The aluminum plate has a thickness preferably in the range of 0.05 to 0.6 mm, more preferably in the range of 0.1 to 0.4 mm, and most preferably in the range of 0.15 to 0.3 mm.

The surface of the aluminum plate is preferably subjected to a roughening treatment. The roughening treatment can be mechanically, electrochemically or chemically conducted. Examples of the mechanical roughening treatments include a ball grinding treatment, a brush grinding treatment, a blast grinding treatment and a buff grinding treatment. The electrochemical roughening treatment can be conducted by a process, in which a direct or alternative current is applied to the plate in an electrolysis solution containing an acid such as hydrochloric acid or nitric acid. The electrolytic roughening treatment can be conducted in a mixture of two or more acids (described in Japanese Patent Provisional Publication No. 54(1979)-63902). The chemical roughening treatment can be conducted by a process, in which the aluminum plate is preferably immersed in a saturated aqueous solution of aluminum salt with mineral acid (described in Japanese Patent Provisional Publication No. 54(1979)-31187).

After the roughening treatment, the aluminum plate preferably has a surface roughness of Ra (average along the central line) in the range of 0.2 to 1.0 μm.

After the roughening treatment, the aluminum plate can be subjected to an alkali etching treatment. The alkali etching solution preferably is an aqueous solution of potassium hydroxide or sodium hydroxide. A neutralizing treatment is preferably conducted after the alkali etching treatment.

The aluminum plate is preferably subjected to an anodic oxidation treatment to improve an abrasion resistance of the support.

The anodic oxidation treatment can use various electrolytes to form a porous oxide film. Examples of the electrolytes include sulfuric acid, hydrochloric acid, oxalic acid, chromic acid, and mixtures thereof.

The anodic oxidation treatment is generally conducted under the conditions that the concentration of the electrolytic solution is in the range of 1 to 80 wt. %, the temperature of the solution is in the range of 5 to 70° C., the electric current density is in the range of 5 to 60 A/dm$^2$, the voltage is in the range of 1 to 100 V and the time for electrolysis is in the range of 10 seconds to 5 minutes.

The oxide film formed by the anodic oxidation has a thickness preferably in the range of 1.0 to 5.0 g/m$^2$, and more preferably in the range of 1.5 to 4.0 g/m$^2$.

[Water-soluble Overcoating Layer]

A water-soluble overcoating layer can be provided on the image-forming layer to protect the surface of the image-forming layer from stain caused by an oleophilic substance.

The water-soluble overcoating layer is made of a substance that can easily be removed in printing. The substance preferably is a water-soluble organic polymer. Examples of the water-soluble organic polymers include polyvinyl alcohol, polyvinyl acetate, polyacrylic acid, salts thereof with alkali metals and amines, polymethacrylic acid, salts thereof with alkali metals and amines, polyacrylamide, polyhydroxyethyl acrylate, polyvinyl pyrrolidone, polyvinyl methyl ether, poly-2-acrylamice-2-methyl-1- propanesulfonic acid, salts thereof with alkali metals and amines, gum arabic, cellulose-ethers (e.g., carboxymethylcellulose, carboxyethylcellulose, methylcellulose), dextrin and derivatives thereof (e.g., white dextrin, dextrin decomposed with enzyme, etherized dextrin, pullulan).

The polymer can be a copolymer having two or more repeating units of water-soluble organic polymers. Examples of the copolymers include vinyl alcohol-vinyl acetate copolymer (partially saponified polyvinyl acetate) and vinyl methyl ether-maleic anhydride copolymer. In the case where the vinyl alcohol-vinyl acetate copolymer is prepared by partially saponifying polyvinyl acetate, the saponification degree is preferably 65% or more.

Two or more water-soluble organic polymers can be used in combination.

The overcoating layer can contain an agent capable of converting light to heat, which is described above. The converting agent contained in the overcoating layer preferably is water-soluble.

A coating solution for the overcoating layer can contain a nonionic surface active agent (e.g., polyoxyethylene nonylphenyl ether, polyoxyethylene dodecyl ether).

The coating amount of the overcoating layer is preferably in the range of 0.1 to 2.0 g/m².

[Imagewise Heating Step]

The presensitized lithographic printing plate is imagewise heated to form an image. The presensitized plate can be imagewise heated with a thermal recording head. The image formation using the thermal head does not require an agent capable of converting light to light.

The agent capable of converting light to heat is preferably used, since the thermal recording head generally gives an image with low resolution. An imagewise exposure of light generally gives an image of higher resolution.

The presensitized plate can be imagewise exposed to light through an original image (analog data). The presensitized plate can also be scanned with light corresponding to original image data (usually, digital data).

In the former analog exposure, the light source preferably is a xenon discharge lamp or an infrared lamp. A flash exposure can be conducted for a short time, where a high power lamp such as a xenon lamp is used as the light source.

In the latter scanning exposure, a laser, particularly an infrared laser, is generally used. The infrared laser preferably emits rays in the wavelength region of 700 to 1,200 nm. The laser preferably is a high power solid infrared laser (e.g., semiconductor laser, YAG laser).

When the image-forming layer containing an agent capable of converting light to heat is exposed to the scanning laser beam, the light energy of the beam is converted into thermal energy. A shell polymer of the microcapsules is decomposed to release a polymerizable compound in the heated area (imaging area) of the presensitized plate. The polymerizable compound is polymerized to harden the heated area. Thus, a hydrophobic area is formed on a hydrophilic support.

On the other hand, the polymerizable compound in the unheated area (non-imaging area) is not changed in the plate.

[Developing and Printing Steps]

The imagewise exposed plate is developed to form a lithographic printing plate.

The unheated area (non-imaging area) can be easily removed from the plate with water or an aqueous solution at a development process. The step of removing the unheated area (developing process) can be replaced with an on-press development. In the on-press development, the imagewise heated plate is installed in a printer (attached to a cylinder), and subjected to usual printing treatments. The plate can be developed with the printing treatments using dampening water and ink, and successively a printing process is conducted by using the plate, the dampening water and the ink. The unheated area (non-imaging area) of the image-forming layer is removed with dampening water, ink or rubbing force of printing treatment, when the printer is worked.

The process can comprise the steps of: installing a presensitized lithographic plate on a cylinder of a printer, exposing the plate to a laser (emitted from a light source is attached to the printer), and subjecting the plate to on-press development with dampening water and ink. A printer equipped with a laser-exposing apparatus (disclosed in Japanese Patent No. 2,938,398) can be used to conduct the steps of exposure to printing successively.

After the development, the printing plate can be heated to cause a reaction of an un-reacted polymerizable compound (which remains in the imaging area) to further improve the endurance (plate wear) of the printing plate.

PRELIMINARY EXPERIMENT 1

(Synthesis of Isocyanate Adduct)

With dehydrated ethyl acetate, 1 mol of well-dried polyol (2) was mixed. The mixture was cooled with water. To the mixture, 2 mol of m-xylylene diisocyanate and a catalytic amount of tin(II) octylate were added under nitrogen atmosphere. The resulting mixture was stirred at the room temperature for 1 hour. The mixture was further stirred at 50° C. for 3 hours to synthesize the isocyanate adduct (a).

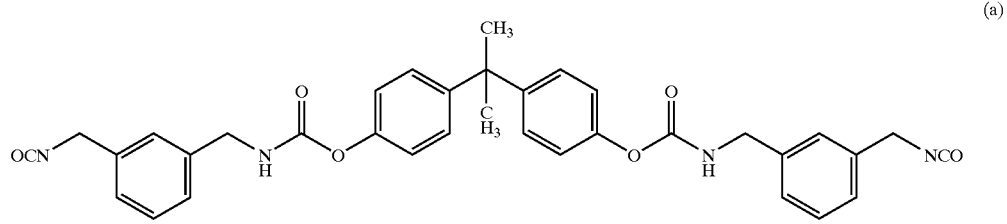

(a)

(Measurement of Decomposition Temperature)

On a glass plate, 33 wt. % methyl acetate solution of the isocyanate adduct (a) was coated, and dried at 80° C. for 1 minute. The plate was immersed in water, which was pre-heated at 40° C., for 3 hours to react isocyanate groups with water. The plate was dried at room temperature for one day and night to form a polymer membrane. The polymer membrane was heated at a heating rate of 10° C. per minute in a thermal analyzer (TG/DTA22, Seiko Instruments Inc.) to obtain a starting temperature of mass reduction as a thermal decomposition initiating temperature. The results are set forth in Table 1.

PRELIMINARY EXPERIMENT 2

(Synthesis of Isocyanate Adduct)

With 2 mol of m-xylylene diisocyanate, 1 mol of polyol (3) was reacted in the same manner as in Preliminary Experiment 1 to synthesize the isocyanate adduct (b).

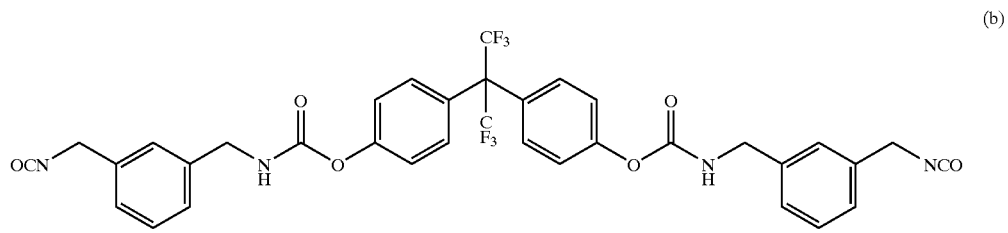

(b)

(Measurement of Decomposition Temperature)

A starting temperature of mass reduction was measured as a thermal decomposition initiating temperature in the same manner as in Preliminary Experiment 1 except that the isocyanate adduct (b) was used. The results are set forth in Table 1.

PRELIMINARY EXPERIMENT 3
(Synthesis of Isocyanate Adduct)

With 2 mol of m-xylylene diisocyanate, 1 mol of polyol (4) was reacted in the same manner as in Preliminary Experiment 1 to synthesize the isocyanate adduct (c).

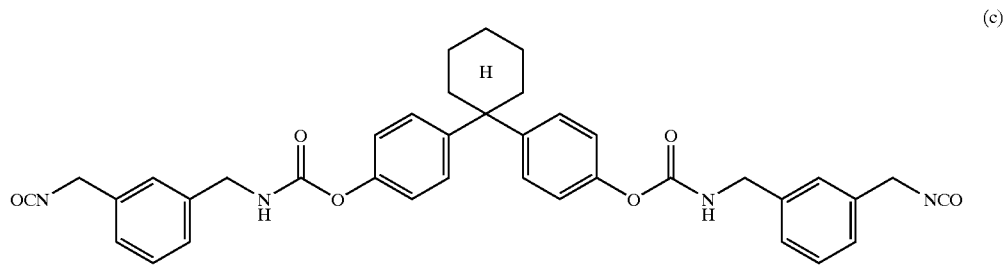

(c)

(Measurement of Decomposition Temperature)

A starting temperature of mass reduction was measured as a thermal decomposition initiating temperature in the same manner as in Preliminary Experiment 1 except that the isocyanate adduct (c) was used. The results are set forth in Table 1.

PRELIMINARY EXPERIMENT 4
(Synthesis of Isocyanate Adduct)

With 2 mol of m-xylylene diisocyanate, 1 mol of polyol (10) was reacted in the same manner as in Preliminary Experiment 1 to synthesize the isocyanate adduct (d).

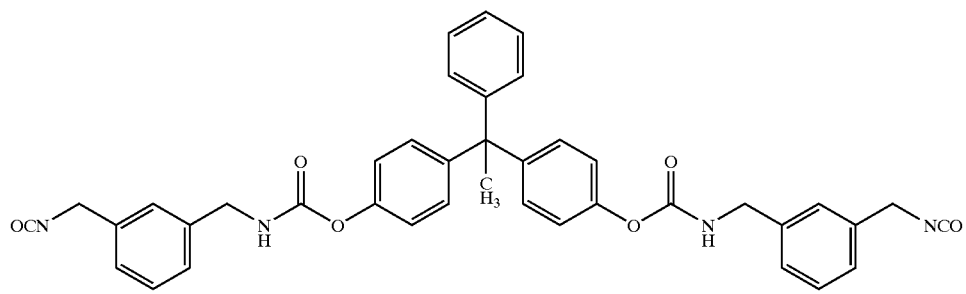

(d)

(Measurement of Decomposition Temperature)

A starting temperature of mass reduction was measured as a thermal decomposition initiating temperature in the same manner as in Preliminary Experiment 1 except that the isocyanate adduct (d) was used. The results are set forth in Table 1.

PRELIMINARY EXPERIMENT 5
(Synthesis of Isocyanate Adduct)

With 4 mol (an excess amount) of m-xylylene diisocyanate, 1 mol of polyol (24) was reacted in the same manner as in Preliminary Experiment 1 to synthesize the isocyanate adduct (e).

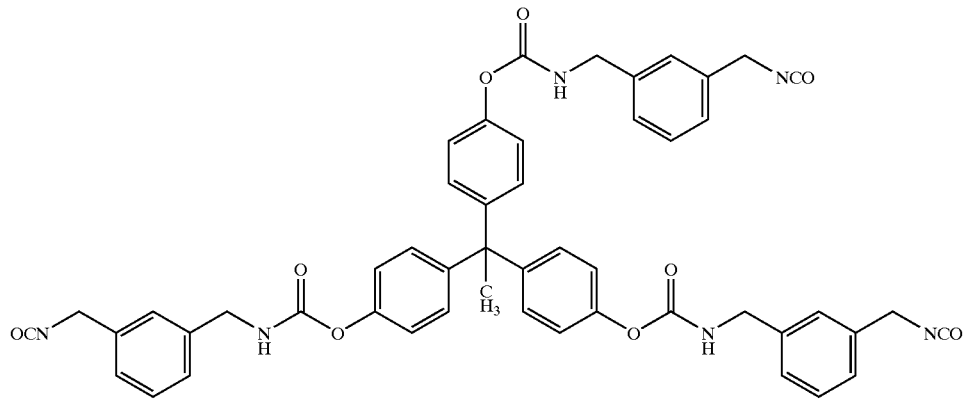

(Measurement of Decomposition Temperature)

A starting temperature of mass reduction was measured as a thermal decomposition initiating temperature in the same manner as in Preliminary Experiment 1 except that the isocyanate adduct (e) was used. The results are set forth in Table 1.

PRELIMINARY EXPERIMENT 6
(Synthesis of Isocyanate Adduct)

With 4 mol (an excess amount) of m-xylylene diisocyanate, 1 mol of polyol (27) was reacted in the same manner as in Preliminary Experiment 1 to synthesize the isocyanate adduct (f).

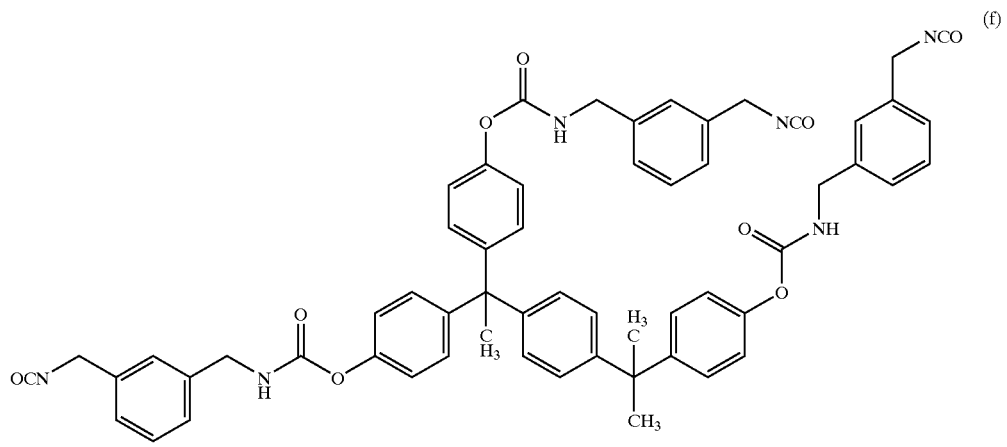

(Measurement of Decomposition Temperature)

A starting temperature of mass reduction was measured as a thermal decomposition initiating temperature in the same manner as in Preliminary Experiment 1 except that the isocyanate adduct (f) was used. The results are set forth in Table 1.

PRELIMINARY EXPERIMENT 7
(Synthesis of Isocyanate Adduct)

With 4 mol (an excess amount) of m-xylylene diisocyanate, 1 mol of polyol (29) was reacted in the same manner as in Preliminary Experiment 1 to synthesize the isocyanate adduct (g).

(Measurement of Decomposition Temperature)

A starting temperature of mass reduction was measured as a thermal decomposition initiating temperature in the same manner as in Preliminary Experiment 1 except that the isocyanate adduct (x) was used. The results are set forth in Table 1.

PRELIMINARY EXPERIMENT 9
(Measurement of Decomposition Temperature)

With 0.7 weight part of the isocyanate adduct (x), 0.3 weight part of the isocyanate adduct (a) was mixed. The starting temperature of mass reduction was measured as a

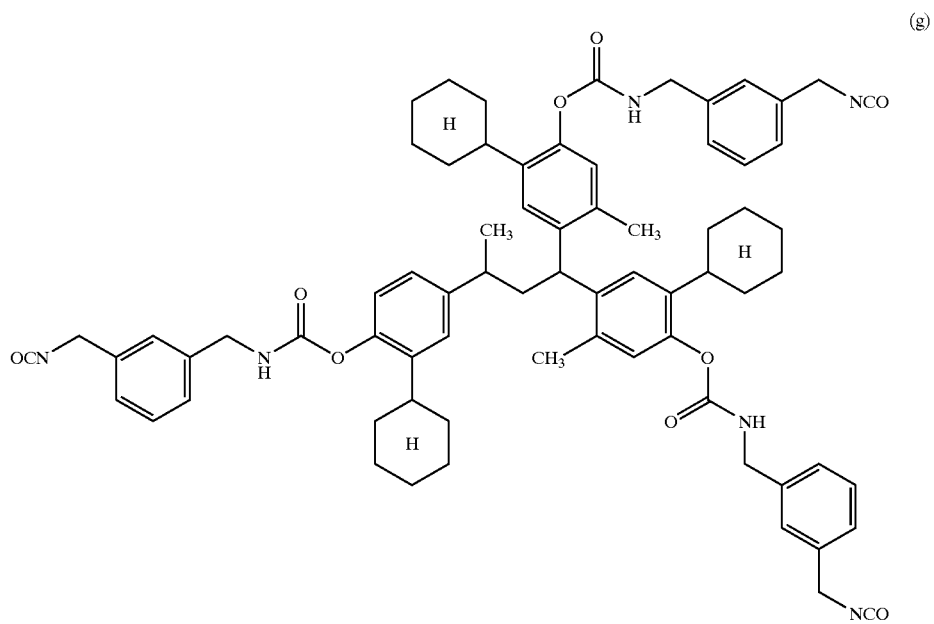

(g)

(Measurement of Decomposition Temperature)

A starting temperature of mass reduction was measured as a thermal decomposition initiating temperature in the same manner as in Preliminary Experiment 1 except that the isocyanate adduct (g) was used. The results are set forth in Table 1.

PRELIMINARY EXPERIMENT 8
(Synthesis of Isocyanate Adduct)

An adduct of trimethylol propane and m-xylylene diisocyanate (Takenate D-110N, Mitsui Takeda Chemicals, Inc.) was used as the isocyanate adduct (x).

thermal decomposition initiating temperature in the same manner as in Preliminary Experiment 1 except that the mixture was used. The results are-set forth in Table 1.

PRELIMINARY EXPERIMENT 10
(Measurement of Decomposition Temperature)

With 0.5 weight part of the isocyanate adduct (x), 0.5 weight part of the isocyanate adduct (b) was mixed. The starting temperature of mass reduction was measured as a thermal decomposition initiating temperature in the same manner as in Preliminary Experiment 1 except that the mixture was used. The results are set forth in Table 1.

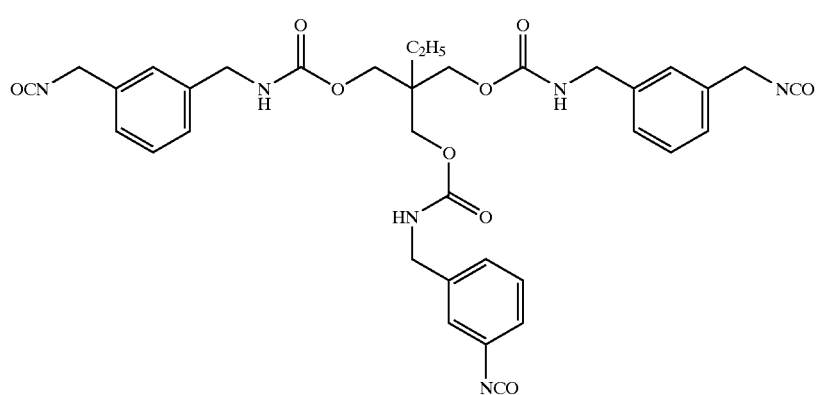

(x)

PRELIMINARY EXPERIMENT 11

(Measurement of Decomposition Temperature)

With 0.5 weight part of the isocyanate adduct,(x), 0.5 weight part of the isocyanate adduct (f) was mixed. The starting temperature of mass reduction was measured as a thermal decomposition initiating temperature in the same manner as in Preliminary Experiment 1 except that the mixture was used. The results are set forth in Table 1.

TABLE 1

| Preliminary experiment | Polyol | | Amount of m-xylylene diisocyanate | Isocyanate adduct | Decomposition temperature |
|---|---|---|---|---|---|
| | Compound | Amount | | | |
| 1 | (2) | 1 mol | 2 mol | (a) | 265° C. |
| 2 | (3) | 1 mol | 2 mol | (b) | 252° C. |
| 3 | (4) | 1 mol | 2 mol | (c) | 265° C. |
| 4 | (10) | 1 mol | 2 mol | (d) | 280° C. |
| 5 | (24) | 1 mol | 4 mol | (e) | 235° C. |
| 6 | (27) | 1 mol | 4 mol | (f) | 246° C. |
| 7 | (29) | 1 mol | 4 mol | (g) | 242° C. |
| 8 | Trimethylol propane | 1 mol | 3 mol | (x) | 294° C. |

| Preliminary experiment | Isocyanate adduct (I) | | Isocyanate adduct (II) | | Decomposition temperature |
|---|---|---|---|---|---|
| | Compound | Amount | Compound | Amount | |
| 9 | (a) | 0.3 wt. part | (x) | 0.7 wt. part | 274° C. |
| 10 | (b) | 0.5 wt. part | (x) | 0.5 wt. part | 230° C. |
| 11 | (f) | 0.5 wt. part | (x) | 0.5 wt. part | 269° C. |

EXAMPLE 1

(Preparation of Microcapsule Dispersion)

The isocyanate adduct (a) prepared in Preliminary Experiment 1 was dissolved in ethyl acetate to prepare a 50 wt. % solution. In 25 g of ethyl acetate, 30 g of the prepared solution, 10 g of the following polymerizable compound (vinyl ether), 3 g of the following agent capable of converting light to heat and 0.2 g of an anionic surface active agent (Bionine A-41-C, Takemoto Oil & Fat Co., Ltd.) were dissolved to prepare an oily phase.

(Polymerizable compound)

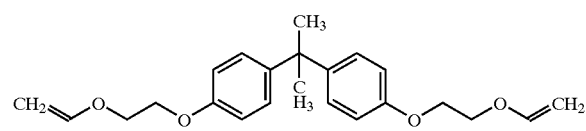

(Agent Capable of Converting Light to Heat)

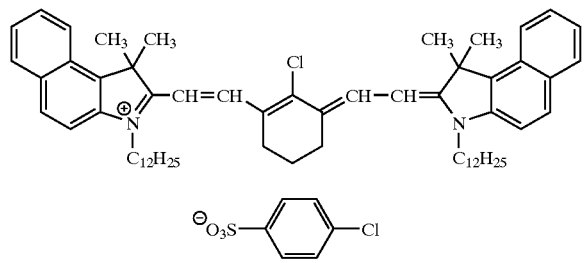

Polyvinyl alcohol (PVA205, Kuraray Co., Ltd.) was dissolved in water in the amount of 4 wt. % to prepare 80 g of an aqueous phase.

The oily phase and the aqueous phase was emulsified in a homogenizer at 12,000 rpm for 10 minutes. The obtained emulsion was added to 50 g of 1.5 wt. % aqueous solution of tetraethylene pentamine. The mixture was stirred at room temperature for 30 minutes, and further stirred at 40° C. for 3 hours to prepare microcapsule dispersion. The dispersion was diluted with distilled water up to a solid content of 20 wt. %. The microcapsules had the average particle size of 0.4 μm.

(Preparation of Hydrophilic Support)

Melt of an aluminum alloy according to JIS-A-1050 containing Al (99.5% or more), Fe (0.30%), Si (0.10%), Ti (0.02%) and Cu (0.013%) was cleaned and molded. For cleaning the melt, the melt was degassed to remove contaminating gases such as hydrogen gas, and then filtrated through a ceramic tube filter. For molding the melt, the DC molding was carried out. The solidified molded metal was a plate having 500 mm thickness. The plate was planed off by 10 mm, and then subjected to homogenizing treatment at 550° C. for 10 hours so that the intermetallic compounds might not agglomerate. After hot rolling at 400° C., the plate was annealed at 500° C. for 60 seconds in an annealing furnace. The plate was then subjected to cold rolling to obtain an aluminum plate having 0.30 mm thickness. The surface of the rolling mill was beforehand controlled to have such roughness that the aluminum plate might have a central surface roughness (Ra) of 0.2 μm. The aluminum plate was then installed in a tension leveler.

The obtained plate was subjected to surface treatment for a lithographic printing plate.

First, the plate was subjected to oil-removing treatment with a 10 wt. % aqueous solution of sodium aluminate at 50° C. for 30 seconds to remove the rolling oil on the surface of the plate. The plate was then neutralized with a 30 wt. % aqueous solution of sulfuric acid at 50° C. for 30 seconds, and the smut was removed.

Next, for improving adhesion between the support and the image-forming layer and for increase water-holding capacity of the non-imaging area, the plate surface was subjected to roughing treatment (what is called sand roughing). In an aqueous solution containing 1 wt. % nitric acid and 0.5 wt. % aluminum nitrate at 45° C., the plate was subjected to electrolytic sand roughing treatment. In the treatment, while an aluminum web was left in the solution, an indirect power cell supplied an alternative current under the conditions of the electric current density of 20 A/dm$^2$, the duty ratio of 1:1 and the anodic electricity of 240 C/dm$^2$. After the treatment, the plate was subjected to etching treatment with a 10 wt. % aqueous solution of sodium aluminate at 50° C. for 30 seconds. The plate was then neutralized with a 30 wt. % aqueous solution of sulfuric acid at 50° C. for 30 seconds, and the smut was removed.

Further, an oxide film was formed on the support by anodic-oxidation to improve abrasion resistance, chemical resistance and water-holding capacity. An indirect power cell supplied a direct current of 14 A/dm$^2$ to electrolyze for forming an oxide film of 2.5 g/m$^2$, while an aluminum web was left in a 20% aqueous solution of sulfuric acid at 35° C.

The plate was subjected to silicate treatment as a hydrophilic treatment for the non-imaging area. In the treatment, the plate was made contact with an aluminum web for 15 seconds in a 1.5% aqueous solution of sodium silicate (No. 3) at 70° C., and washed with water. The amount of attached Si was 10 mg/m$^2$.

The prepared support had a surface roughness (Ra) measured along the central line of 0.25 μm (Formation of Image-forming Layer)

On the hydrophilic support, the coating solution consisting of the following components was coated by a bar coater, and dried at 70° C. for 90 seconds in an oven to form an image-forming layer. The image-forming layer had a dried weight of 1.0 g/m².

A presensitized lithographic printing plate was prepared.

| Coating solution for image-forming layer | |
|---|---|
| Water | 75 g |
| The microcapsule dispersion | 25 g |
| The following acid precursor | 0.5 g |

(Acid precursor)

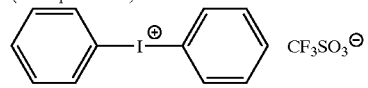

(Process, Print and Evaluation)

The above-produced presensitized plate was imagewise exposed in an image setter (Trendsetter 3244VFS, Creo) equipped with a water-cooling semiconductor infrared laser of 40 W. The exposing conditions were the laser power of 9 V, the outer drum rotation of 210 rpm, the plate surface energy of 400 mJ/m² and the resolution of 2,400 dpi. The plate was then attached to a cylinder of an automatic developing machine (SOR-M, Heidelberg) without conducting a development process. After dampening water was supplied to the machine, an ink and then paper were supplied to the machine. Printing was carried out.

As a result, a development was conducted on machine without any problems. The plate wear was 40,000 sheets.

EXAMPLES 2–10

A presensitized lithographic plate was prepared, processed, printed and evaluated in the same manner as in Example 1, except that the isocyanate adduct in preparation of microcapsules was changed as is shown in Table 2. The results are set forth in Table. 2.

Comparison Example 1

A presensitized lithographic plate was prepared, processed, printed and evaluated in the same manner as in Example 1, except that the isocyanate adduct (x) prepared in Preliminary Experiment 8 was used in preparation of microcapsules. The results are set forth in Table 2.

TABLE 2

| Presensitized lithographic plate | Isocyanate adduct | Decomposition temperature | Plate wear (number of printed sheets) |
|---|---|---|---|
| Example 1 | (a) | 265° C. | 40,000 |
| Example 2 | (b) | 252° C. | 38,000 |
| Example 3 | (c) | 265° C. | 45,000 |
| Example 4 | (d) | 280° C. | 40,000 |
| Example 5 | (e) | 235° C. | 48,000 |
| Example 6 | (f) | 246° C. | 45,000 |
| Example 7 | (g) | 242° C. | 50,000 |
| Example 8 | 0.3(a) + 0.7(x) | 274° C. | 42,000 |
| Example 9 | 0.5(b) + 0.5(x) | 230° C. | 45,000 |
| Example 10 | 0.5(f) + 0.5(x) | 269° C. | 50,000 |
| Comp. Ex. 1 | (x) | 294° C. | 25,000 |

EXAMPLE 11

(Preparation of Microcapsule Dispersion)

A microcapsule dispersion was prepared in the same manner as in Example 1, except that an epoxy resin (Epicoat 1004, Japan Epoxy Resin Co., Ltd.) was used in place of a vinyl ether, and that distilled water was used in place of 1.5 wt. % aqueous solution of tetraethylene pentamine.

(Formation of Image-forming Layer)

On the hydrophilic support prepared in Example 1, the coating solution consisting of the following components was coated by a bar coater, and dried at 70° C. for 90 seconds in an oven to form an image-forming layer. The image-forming layer had a dried weight of 1.0 g/m².

A presensitized lithographic printing plate was prepared.

| Coating solution for image-forming layer | |
|---|---|
| Water | 75 g |
| The microcapsule dispersion | 25 g |

(Process, Print and Evaluation)

The above-produced presensitized plate was processed, printed and evaluated in the same manner as in Example 1. The results are set forth in Table 3.

EXAMPLES 12–20

A presensitized lithographic plate was prepared, processed, printed and evaluated in the same manner as in Example 11, except that the isocyanate adduct in preparation of microcapsules was changed as is shown in Table 3. The results are set forth in Table 3.

Comparison Example 2

A presensitized lithographic plate was prepared, processed, printed and evaluated in the same manner as in Example 11, except that the isocyanate adduct (x) prepared in Preliminary Experiment 8 was used in preparation of microcapsules. The results are set forth in Table 3.

TABLE 3

| Presensitized lithographic plate | Isocyanate adduct | Decomposition temperature | Plate wear (number of printed sheets) |
|---|---|---|---|
| Example 11 | (a) | 265° C. | 39,000 |
| Example 12 | (b) | 252° C. | 35,000 |
| Example 13 | (c) | 265° C. | 43,000 |
| Example 14 | (d) | 280° C. | 42,000 |
| Example 15 | (e) | 235° C. | 45,000 |
| Example 16 | (f) | 246° C. | 40,000 |
| Example 17 | (g) | 242° C. | 50,000 |
| Example 18 | 0.3(a) + 0.7(x) | 274° C. | 42,000 |
| Example 19 | 0.5(b) + 0.5(x) | 230° C. | 43,000 |
| Example 20 | 0.5(f) + 0.5(x) | 269° C. | 48,000 |
| Comp. Ex. 2 | (x) | 294° C. | 23,000 |

EXAMPLE 21

(Preparation of Microcapsule Dispersion)

The isocyanate adduct (a) prepared in Preliminary Experiment 1 was dissolved in ethyl acetate to prepare a 50 wt. % solution. In 27 g of ethyl acetate, 40 g of the prepared solution, 5 g of tetramethylolpropane tetraacrylate, 5 g of allyl methacrylate/butyl methacrylate copolymer (copolymerization ratio=7/3), 3 g of the agent capable of converting light to heat used in Example 1, 1 g of the following iodonium salt and 0.2 g of an anionic surface active agent (Bionine A-41-C, Takemoto Oil & Fat Co., Ltd.) were dissolved to prepare an oily phase.

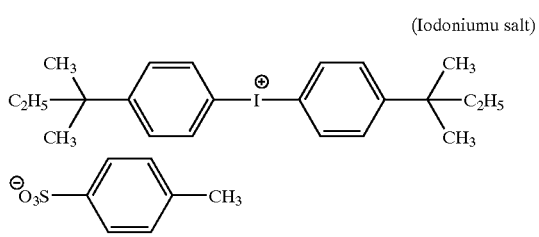
(Iodoniumu salt)

Polyvinyl alcohol (PVA205, Kuraray Co., Ltd.) was dissolved in water in the amount of 4 wt. % to prepare 90 g of an aqueous phase.

The oily phase and the aqueous phase was emulsified in a homogenizer at 12,000 rpm for 10 minutes. The obtained emulsion was added to 50 g of 1.5 wt. % aqueous solution of tetraethylene pentamine. The mixture was stirred at room temperature for 30 minutes, and further stirred at 40° C. for 3 hours to prepare microcapsule dispersion. The dispersion was diluted with distilled water up to a solid content of 20 wt. %. The microcapsules had the average particle size of 0.38 μm.

(Formation of Image-forming Layer)

On the hydrophilic support prepared in Example 1, the coating solution consisting of the following components was coated by a bar coater, and dried at 70° C. for 90 seconds in an oven to form an image-forming layer. The image-forming layer had a dried weight of 1.0 g/m².

A presensitized lithographic printing plate was prepared.

| Coating solution for image-forming layer | |
|---|---|
| Water | 75 g |
| The microcapsule dispersion | 25 g |

(Process, Print and Evaluation)

The above-produced presensitized plate was processed, printed and evaluated in the same manner as in Example 1. The results are set forth in Table 4.

EXAMPLES 22–30

A presensitized lithographic plate was prepared, processed, printed and evaluated in the same manner as in Example 21, except that the isocyanate adduct in preparation of microcapsules was changed as is shown in Table 4. The results are set forth in Table 4.

Comparison Example 3

(Preparation of Microcapsule Dispersion)

In 60 g of ethyl acetate, 40 g of the adduct of trimethylol propane and m-xylylene diisocyanate (Takenate D-110N, Mitsui Takeda Chemicals, Inc.), 10 g of tetramethylolpropane tetraacrylate, 10 g of allyl methacrylate/butyl methacrylate copolymer (copolymerization ratio=7/3), 3 g of the agent capable of converting light to heat used in Example 1, 2 g of the iodonium salt used in Example 21 and 0.1 g of an anionic surface active agent (Bionine A-41-C, Takemoto Oil & Fat Co., Ltd.) were dissolved to prepare an oily phase.

Polyvinyl alcohol (PVA205, Kuraray Co., Ltd.) was dissolved in water in the amount of 4 wt. % to prepare 120 g of an aqueous phase.

The oily phase and the aqueous phase was emulsified in a homogenizer at 10,000 rpm for 10 minutes. The obtained emulsion was added to 50 g of 1.5 wt. % aqueous solution of tetraethylene pentamine. The mixture was stirred at room temperature for 30 minutes, and further stirred at 40° C. for 3 hours to prepare microcapsule dispersion. The dispersion was diluted with distilled water up to a solid content of 10 wt. %. The microcapsules had the average particle size of 0.39 μm.

(Process, Print and Evaluation)

A presensitized lithographic plate was prepared, processed, printed and evaluated in the same manner as in Example 21, except that the above-prepared microcapsule dispersion was used. The results are set forth in Table 4.

TABLE 4

| Presensitized lithographic plate | Isocyanate adduct | Decomposition temperature | Plate wear (number of printed sheets) |
|---|---|---|---|
| Example 21 | (a) | 265° C. | 38,000 |
| Example 22 | (b) | 252° C. | 39,000 |
| Example 23 | (c) | 265° C. | 43,000 |
| Example 24 | (d) | 280° C. | 41,000 |
| Example 25 | (e) | 235° C. | 42,000 |
| Example 26 | (f) | 246° C. | 41,000 |
| Example 27 | (g) | 242° C. | 44,000 |
| Example 28 | 0.3(a) + 0.7(x) | 274° C. | 45,000 |
| Example 29 | 0.5(b) + 0.5(x) | 230° C. | 41,000 |
| Example 30 | 0.5(f) + 0.5(x) | 269° C. | 42,000 |
| Comp. Ex. 3 | (x) | 294° C. | 20,000 |

PRELIMINARY EXPERIMENT 12

(Synthesis of Isocyanate Adduct)

With dehydrated ethyl acetate, 1 mol of well-dried polyol (51) was mixed. The mixture was cooled with water. To the mixture, 2 mol of m-xylylene diisocyanate and a catalytic amount of tin(II) octylate were added under nitrogen atmosphere. The resulting mixture was stirred at the room temperature for 1 hour. The mixture was further stirred at 50° C. for 3 hours to synthesize the isocyanate adduct (A).

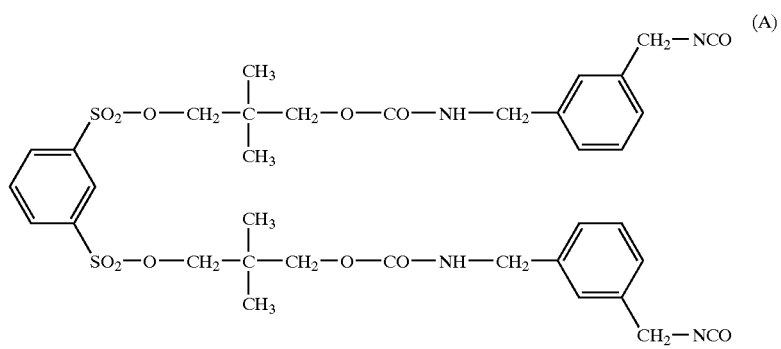

(Measurement of Decomposition Temperature)

On a glass plate, 33 wt. % methyl acetate solution of the isocyanate adduct (A) was coated, and dried at 80° C. for 1 minute. The plate was immersed in water, which was pre-heated at 40° C., for 3 hours to react isocyanate groups with water. The plate was dried at room temperature for one day and night to form a polymer membrane. The polymer membrane was heated at a heating rate of 10° C. per minute in a thermal analyzer (TG/DTA22, Seiko Instruments Inc.) to obtain a starting temperature of mass reduction as a thermal decomposition initiating temperature. The results are set forth in Table 5.

PRELIMINARY EXPERIMENT 13

(Synthesis of Isocyanate Adduct)

With 2 mol of m-xylylene diisocyanate, 1 mol of polyol (52) was reacted in the same manner as in Preliminary Experiment 12 to synthesize the isocyanate adduct (B).

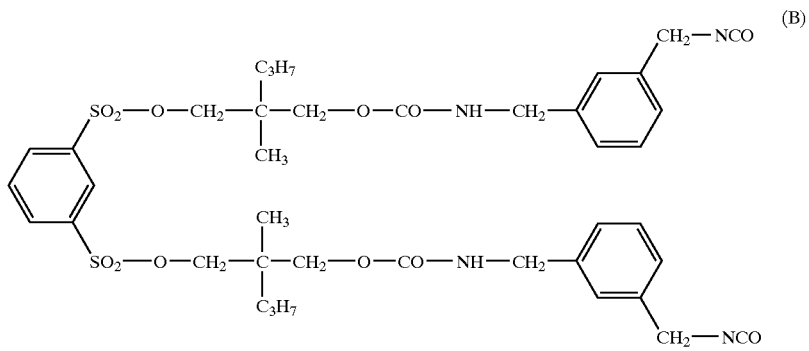

(Measurement of Decomposition Temperature)

A starting temperature of mass reduction was measured as a thermal decomposition initiating temperature in the same manner as in Preliminary Experiment 12 except that the isocyanate adduct (B) was used. The results are set forth in Table 5.

PRELIMINARY EXPERIMENT 14

(Synthesis of Isocyanate Adduct)

With 2 mol of m-xylylene diisocyanate, 1 mol of polyol (53) was reacted in the same manner as in Preliminary Experiment 12 to synthesize the isocyanate adduct (C).

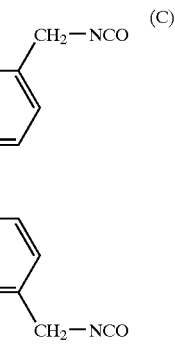

(Measurement of Decomposition Temperature)

A starting temperature of mass reduction was measured as a thermal decomposition initiating temperature in the same manner as in Preliminary Experiment 12 except that the isocyanate adduct (C) was used. The results are set forth in Table 5.

PRELIMINARY EXPERIMENT 15

(Synthesis of Isocyanate Adduct)

With 2 mol of m-xylylene diisocyanate, 1 mol of polyol (54) was reacted in the same manner as in Preliminary Experiment 12 to synthesize the isocyanate adduct (D).

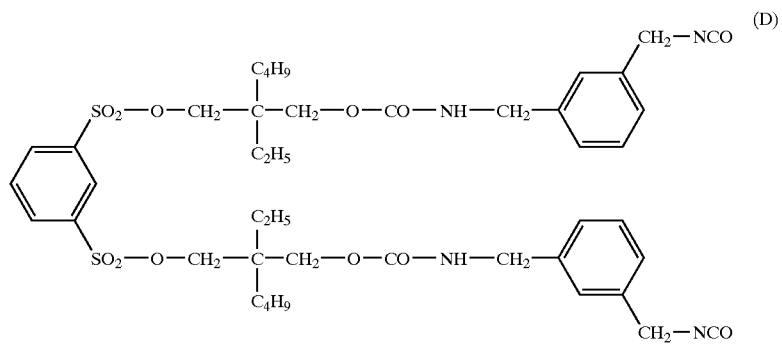

(Measurement of Decomposition Temperature)

A starting temperature of mass reduction was measured as a thermal decomposition initiating temperature in the same manner as in Preliminary Experiment 12 except that the isocyanate adduct (D) was used. The results are set forth in Table 5.

PRELIMINARY EXPERIMENT 16

(Synthesis of Isocyanate Adduct)

With 2 mol of m-xylylene diisocyanate, 1 mol of polyol (55) was reacted in the same manner as in Preliminary Experiment 12 to synthesize the isocyanate adduct (E).

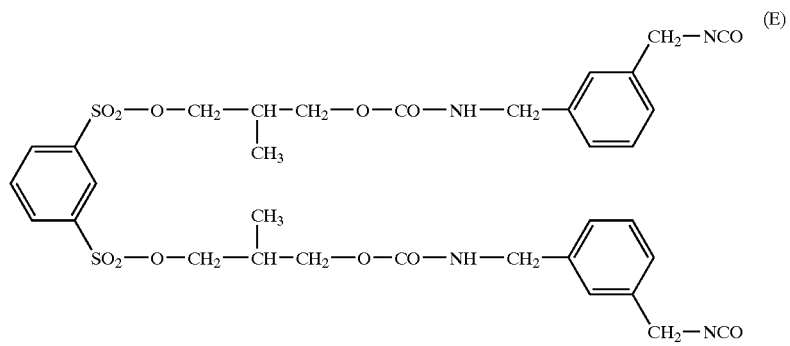

(Measurement of Decomposition Temperature)

A starting temperature of mass reduction was measured as a thermal decomposition initiating temperature in the same manner as in Preliminary Experiment 12 except that the isocyanate adduct (E) was used. The results are set forth in Table 5.

PRELIMINARY EXPERIMENT 17

(Synthesis of Isocyanate Adduct)

With 2 mol of m-xylylene diisocyanate, 1 mol of polyol (57) was reacted in the same manner as in Preliminary Experiment 12 to synthesize the isocyanate adduct (F).

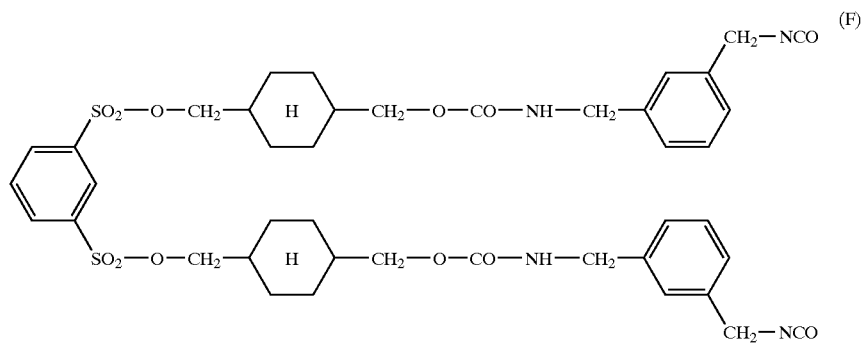

(Measurement of Decomposition Temperature)

A starting temperature of mass reduction was measured as a thermal decomposition initiating temperature in the same manner as in Preliminary Experiment 12 except that the isocyanate adduct (F) was used. The results are set forth in Table 5.

PRELIMINARY EXPERIMENT 18

(Synthesis of Isocyanate Adduct)

With 2 mol of m-xylylene diisocyanate, 1 mol of polyol (59) was reacted in the same manner as in Preliminary Experiment 12 to synthesize the isocyanate adduct (G).

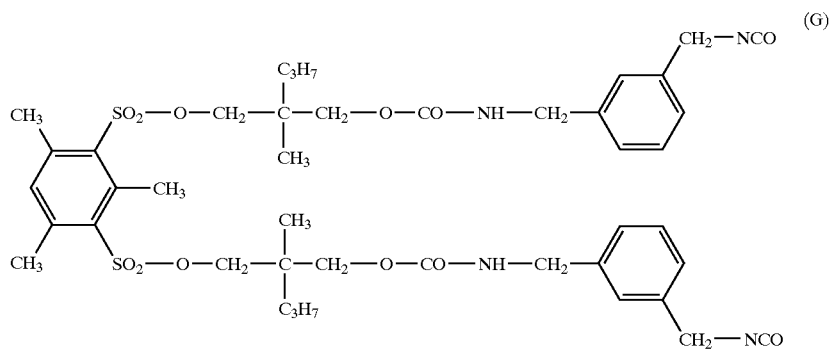

(Measurement of Decomposition Temperature)

A starting temperature of mass reduction was measured as a thermal decomposition initiating temperature in the same manner as in Preliminary Experiment 12 except that the isocyanate adduct (G) was used. The results are set forth in Table 5.

PRELIMINARY EXPERIMENT 19

(Synthesis of Isocyanate Adduct)

With 2 mol of m-xylylene diisocyanate, 1 mol of polyol (60) was reacted in the same manner as in Preliminary Experiment 12 to synthesize the isocyanate adduct (H).

PRELIMINARY EXPERIMENT 21

(Synthesis of Isocyanate Adduct)

With 2 mol of m-xylylene diisocyanate, 1 mol of polyol (68) was reacted in the same manner as in Preliminary Experiment 12 to synthesize the isocyanate adduct (J).

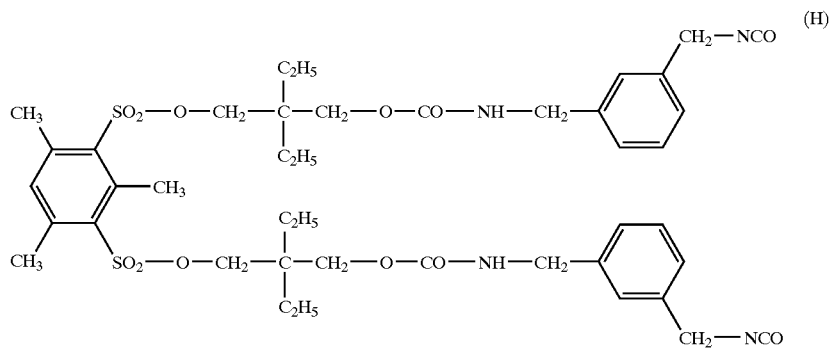

(Measurement of Decomposition Temperature)

A starting temperature of mass reduction was measured as a thermal decomposition initiating temperature in the same manner as in Preliminary Experiment 12 except that the isocyanate adduct (H) was used. The results are set forth in Table 5.

PRELIMINARY EXPERIMENT 20

(Synthesis of Isocyanate Adduct)

With 2 mol of m-xylylene diisocyanate, 1 mol of polyol (66) was reacted in the same manner as in Preliminary Experiment 12 to synthesize the isocyanate-adduct (I).

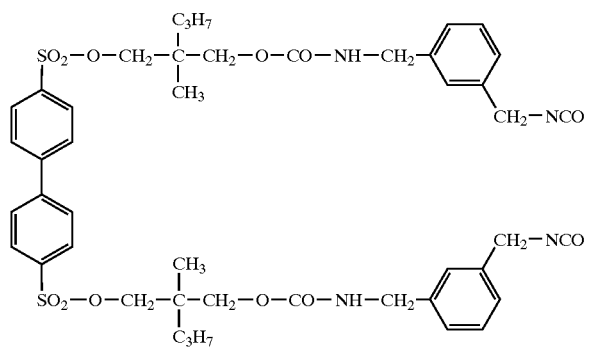

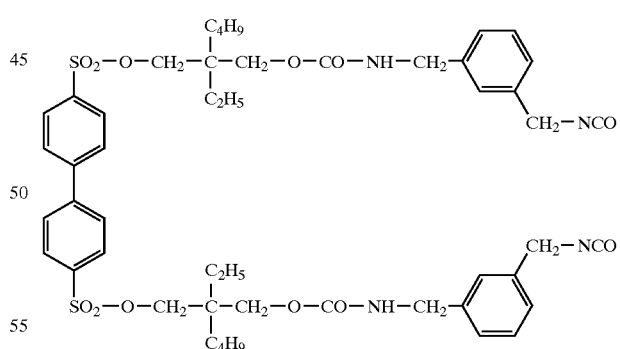

(Measurement of Decomposition Temperature)

A starting temperature of mass reduction was measured as a thermal decomposition initiating temperature in the same manner as in Preliminary Experiment 12 except that the isocyanate adduct (J) was used. The results are set forth in Table 5.

PRELIMINARY EXPERIMENT 22

(Synthesis of Isocyanate Adduct)

With 2 mol of m-xylylene diisocyanate, 1 mol of polyol (73) was reacted in the same manner as in Preliminary Experiment 12 to synthesize the isocyanate adduct (K).

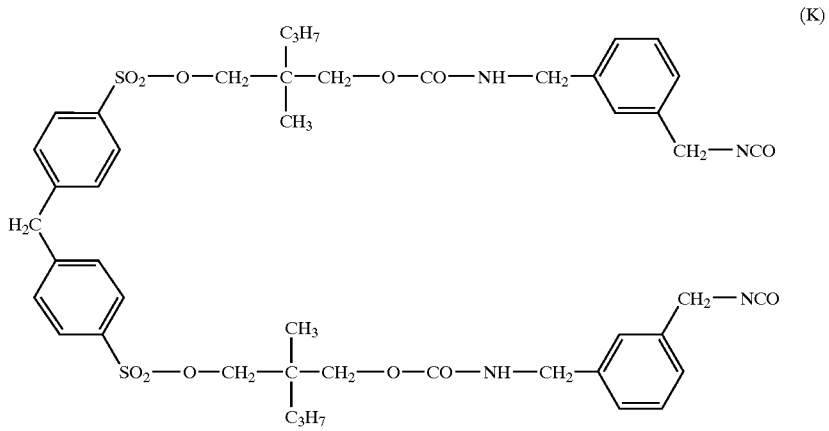

(K)

(Measurement of Decomposition Temperature)

A starting temperature of mass reduction was measured as a thermal decomposition initiating temperature in the same manner as in Preliminary Experiment 12 except that the isocyanate adduct (K) was used. The results are set forth in Table 5.

PRELIMINARY EXPERIMENT 23

(Synthesis of Isocyanate Adduct)

With 2 mol of m-xylylene diisocyanate, 1 mol of polyol (74) was reacted in the same manner as in Preliminary Experiment 12 to synthesize the isocyanate adduct (L).

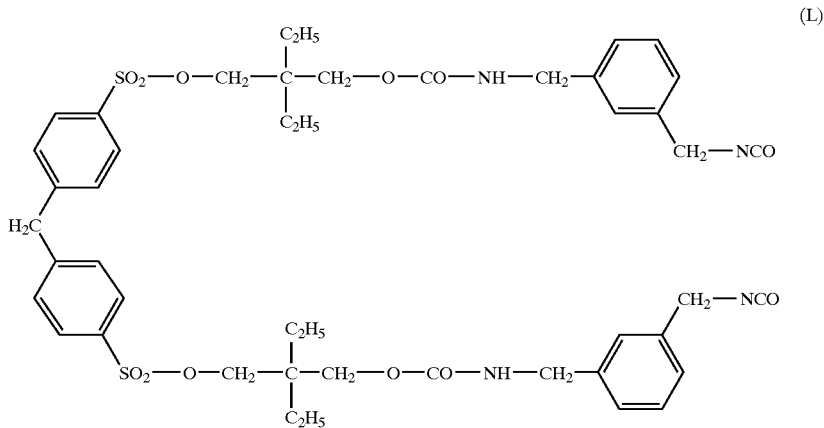

(L)

(Measurement of Decomposition Temperature)

A starting temperature of mass reduction was measured as a thermal decomposition initiating temperature in the same manner as in Preliminary Experiment 12 except that the isocyanate adduct (L) was used. The results are set forth in Table 5.

PRELIMINARY EXPERIMENT 24
(Synthesis of Isocyanate Adduct)

With 2 mol of m-xylylene diisocyanate, 1 mol of polyol (76) was reacted in the same manner as in Preliminary Experiment 12 to synthesize the isocyanate adduct (M).

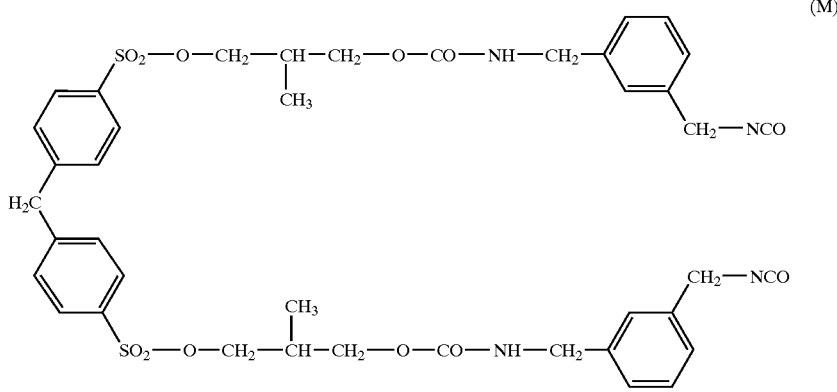
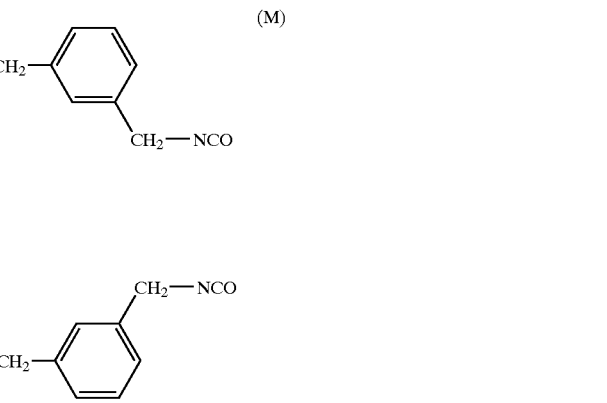

(M)

(Measurement of Decomposition Temperature)

A starting temperature of mass reduction was measured as a thermal decomposition initiating temperature in the same manner as in Preliminary Experiment 12 except that the isocyanate adduct (M) was used. The results are set forth in Table 5.

TABLE 5

| Preliminary experiment | Polyol Compound | Polyol Amount | Amount of m-xylylene diisocyanate | Isocyanate adduct | Decomposition temperature |
|---|---|---|---|---|---|
| 12 | (51) | 1 mol | 2 mol | (A) | 191° C. |
| 13 | (52) | 1 mol | 2 mol | (B) | 190° C. |
| 14 | (53) | 1 mol | 2 mol | (C) | 190° C. |
| 15 | (54) | 1 mol | 2 mol | (D) | 188° C. |
| 16 | (55) | 1 mol | 2 mol | (E) | 202° C. |
| 17 | (57) | 1 mol | 2 mol | (F) | 195° C. |
| 18 | (59) | 1 mol | 2 mol | (G) | 198° C. |
| 19 | (60) | 1 mol | 2 mol | (H) | 193° C. |
| 20 | (66) | 1 mol | 2 mol | (I) | 188° C. |
| 21 | (68) | 1 mol | 2 mol | (J) | 190° C. |
| 22 | (73) | 1 mol | 2 mol | (K) | 192° C. |
| 23 | (74) | 1 mol | 2 mol | (L) | 190° C. |
| 24 | (76) | 1 mol | 2 mol | (M) | 203° C. |
| 8 | Trimethylol propane | 1 mol | 3 mol | (x) | 294° C. |

EXAMPLE 41
(Preparation of Microcapsule Dispersion)

An adduct of m-xylylene diisocyanate and the polyol (51) was prepared in the same manner as in Preliminary Experiment 12. The adduct was dissolved in ethyl acetate to prepare 50 wt. % solution.

In 17 g of ethyl acetate, 5 g of the prepared solution, 5 g of an adduct of trimethylolpropane and m-xylylene diisocyanate (Takenate D-110N, Mitsui Takeda Chemicals, Inc.), 4 g of the polymerizable compound (vinyl ether) used in Example 1', 1.5 g of the agent capable of converting light to heat used in Example 1 and 0.1 g of an anionic surface active agent (Bionine A-41-C, Takemoto Oil & Fat Co., Ltd.) were dissolved to prepare an oily phase.

Polyvinyl alcohol (PVA205, Kuraray Co., Ltd.) was dissolved in water in the amount of 4 wt. % to prepare 40 g of an aqueous phase.

The oily phase and the aqueous phase was emulsified in a homogenizer at 12,000 rpm for 10 minutes. The obtained emulsion was added to 25 g of distilled water. The mixture was stirred at room temperature for 30 minutes, and further stirred at 40° C. for 3 hours to prepare microcapsule dispersion. The dispersion was diluted with distilled water up to a solid content of 20 wt. %. The microcapsules had the average particle size of 0.36 µm.

(Formation of Image-forming Layer)

On the hydrophilic support, the coating solution consisting of the following components was coated by a bar coater, and dried at 70° C. for 90 seconds in an oven to form an image-forming layer. The image-forming layer had a dried weight of 1.0 g/m².

A presensitized lithographic printing plate was prepared.

| Coating solution for image-forming layer | |
|---|---|
| Water | 75 g |
| The microcapsule dispersion | 25 g |
| The acid precursor used in Example 1 | 0.5 g |

(Process, Print and Evaluation)

The above-produced presensitized plate was imagewise exposed in an image setter (Trendsetter 3244VFS, Creo) equipped with a water-cooling semiconductor infrared laser of 40 W. The exposing conditions were the plate surface energy of 300 mJ/m² and the resolution of 2,400 dpi. The plate was then attached to a cylinder of an automatic developing machine (SOR-M, Heidelberg) without conducting a development process. After dampening water was supplied to the machine, an ink and then paper were supplied to the machine. Printing was carried out. The dampening water was 4 wt. % aqueous solution of a commercially available dampening agent (IF-102, Fuji Photo Film Co., Ltd.). The ink was a commercially available oily black ink (Values Black, Dainippon Ink & Chemicals Inc.).

As a result, a development was conducted on machine without any problems. The plate wear was 20,000 sheets.

EXAMPLE 42

A presensitized lithographic-plate was prepared in the same manner as in Example 41, except that the polyol (53) was used in place of the polyol (51). The microcapsules had the average particle size of 0.34 µm.

The prepared plate was processed, printed and evaluated in the same manner as in Example 41.

As a result, a development was conducted on machine without any problems. The plate wear was 23,000 sheets.

EXAMPLE 43

A presensitized lithographic plate was prepared in the same manner as in Example 41, except that the polyol (54) was used in place of the polyol (51). The microcapsules had the average particle size of 0.34 µm.

The prepared plate was processed, printed and evaluated in the same manner as in Example 41.

As a result, a development was conducted on machine without any problems. The plate wear was 25,000 sheets.

EXAMPLE 44

A presensitized lithographic plate was prepared in the same manner as in Example 41, except that the polyol (60) was used in place of the polyol (51). The microcapsules had the average particle size of 0.32 µm.

The prepared plate was processed, printed and evaluated in the same manner as in Example 41.

As a result, a development was conducted on machine without any problems. The plate wear was 30,000 sheets.

EXAMPLE 45

A presensitized lithographic plate was prepared in the same manner as in Example 41, except that the polyol (66) was used in place of the polyol (51). The microcapsules had the average particle size of 0.33 µm.

The prepared plate was processed, printed and evaluated in the same manner as in Example 41.

As a result, a development was conducted on machine without any problems. The plate wear was 20,000 sheets.

EXAMPLE 46

A presensitized lithographic plate was prepared in the same manner as in Example 41, except that the polyol (76) was used in place of the polyol (51). The microcapsules had the average particle size of 0.34 µm.

The prepared plate was processed, printed and evaluated in the same manner as in Example 41.

As a result, a development was conducted on machine without any problems. The plate wear was 25,000 sheets.

Comparison Example 4

In 17 g of ethyl acetate, 10 g of the adduct of trimethylol propane and m-xylylene diisocyanate (Takenate D-110N, Mitsui Takeda Chemicals, Inc.), 4 g of the polymerizable compound used in Example 1, 1.5 g of the agent capable of converting light to heat used in Example 1 and 0.1 g of an anionic surface active agent (Bionine A-41-C, Takemoto Oil & Fat Co., Ltd.) were dissolved to prepare an oily phase.

A presensitized lithographic plate was prepared in the, same manner as in Example 41, except that the above-prepared oily phase was used. The microcapsules had the average particle size of 0.34 µm.

The prepared plate was processed, printed and evaluated in the same manner as in Example 41.

As a result, a development was conducted on machine without any problems. However, the plate wear was 5,000 sheets.

EXAMPLE 47

An adduct of m-xylylene diisocyanate and the polyol (51) was prepared in the same manner as in Preliminary Experiment 12. The adduct was dissolved in ethyl acetate to prepare 50 wt. % solution.

In 17 g of ethyl acetate, 5 g of the prepared solution, 5 g of an adduct of trimethylolpropane and m-xylylene diisocyanate (Takenate D-110N, Mitsui Takeda Chemicals, Inc.), 4 g of a commercially available epoxy resin (Epicoat 1004, Japan Epoxy Resin Co., Ltd.), 1.5 g of the agent capable of converting light to heat used in Example 1 and 0.1 g of an anionic surface active agent (Bionine A-41-C, Takemoto Oil & Fat Co., Ltd.) were dissolved to prepare an oily phase.

A presensitized lithographic plate was prepared in the same manner as in Example 41, except that the above-prepared oily phase was used. The microcapsules had the average particle size of 0.33 µm.

The prepared plate was processed, printed and evaluated in the same manner as in Example 41.

As a result, a development was conducted on machine without any problems. The plate wear was 29,000 sheets.

EXAMPLE 48

A presensitized lithographic plate was prepared in the same manner as in Example 47, except that the polyol (52) was used in place of the polyol (51). The microcapsules had the average particle size of 0.35 µm.

The prepared plate was processed, printed and evaluated in the same manner as in Example 41.

As a result, a development was conducted on machine without any problems. The plate wear was 25,000 sheets.

EXAMPLE 49

A presensitized lithographic plate was prepared in the same manner as-in Example 47, except that the polyol (55) was used in place of the polyol (51). The microcapsules had the average particle size of 0.34 µm.

The prepared plate was processed, printed and evaluated in the same manner as in Example 41.

As a result, a development was conducted on machine without any problems. The plate wear was 25,000 sheets.

EXAMPLE 50

A presensitized lithographic plate was prepared in the same manner as in Example 47, except that the polyol (59) was used in place of the polyol (51). The microcapsules had the average particle size of 0.33 µm.

The prepared plate was processed, printed and evaluated in the same manner as in Example 41.

As a result, a development was conducted on machine without any problems. The plate wear was 26,000 sheets.

EXAMPLE 51

A presensitized lithographic plate was prepared in the same manner as in Example 47, except that the polyol (68) was used in place of the polyol (51). The microcapsules had the average particle size of 0.31 µm.

The prepared plate was processed, printed and evaluated in the same manner as in Example 41.

As a result, a development was conducted on machine without any problems. The plate wear was 25,000 sheets.

EXAMPLE 52

A presensitized lithographic plate was prepared in the same manner as in Example 47, except that the polyol (73) was used in place of the polyol (51). The microcapsules had the average particle size of 0.32 µm.

The prepared plate was processed, printed and evaluated in the same manner as in Example 41.

As a result, a development was conducted on machine without any problems. The plate wear was 24,000 sheets.

Comparison Example 5

In 17 g of ethyl acetate, 10 g of the adduct of trimethylol propane and m-xylylene diisocyanate (Takenate D-110N, Mitsui Takeda Chemicals, Inc.), 4 g of a commercially available epoxy resin (Epicoat 1004, Japan Epoxy Resin Co., Ltd.), 1.5 g of the agent capable of converting light to heat used in Example 1 and 0.1 g of an anionic surface active agent (Bionine A-41-C, Takemoto Oil & Fat Co., Ltd.) were dissolved to prepare an oily phase.

A presensitized lithographic plate was prepared in the same manner as in Example 41, except that the above-prepared oily phase was used. The microcapsules had the average particle size of 0.35 µm.

The prepared plate was processed, printed and evaluated in the same manner as in Example 41.

As a result, a development was conducted on machine without any problems. However, the plate wear was 4,000 sheets.

EXAMPLE 53

An adduct of m-xylylene diisocyanate and the polyol (51) was prepared in the same manner as in Preliminary Experiment 12. The adduct was dissolved in ethyl acetate to prepare 50 wt. % solution.

In 17 g of ethyl acetate, 5 g of the prepared solution, 5 g of an adduct of trimethylolpropane and m-xylylene diisocyanate (Takenate D-110N, Mitsui Takeda Chemicals, Inc.), 2 g of tetramethylolpropane tetraacrylate, 2 g of allyl methacrylate/butyl methacrylate copolymer (copolymerization ratio=7/3), 1.5 g of the agent capable of converting light to heat used in Example 1, 0.4 g of the iodonium compound used in Example 21 and 0.1 g of an anionic surface active agent (Bionine A-41-C, Takemoto Oil & Fat Co., Ltd.) were dissolved to prepare an oily phase.

A microcapsule dispersion was prepared in the same manner as in Example 41, except that the above-prepared oily phase was used. The microcapsules had the average particle size of 0.32 µm.

On the hydrophilic support prepared in Example 1, the coating solution consisting of the following components was coated by a bar coater, and dried at 70° C. for 90 seconds in an oven to form an image-forming layer. The image-forming layer had a dried weight of 1.0 g/m$^2$.

A presensitized lithographic printing plate was prepared.

| Coating solution for image-forming layer | |
|---|---|
| Water | 75 g |
| The microcapsule dispersion | 25 g |

The prepared plate was processed, printed and evaluated in the same manner as in Example 41.

As a result, a development was conducted on machine without any problems. The plate wear was 23,000 sheets.

EXAMPLE 54

A presensitized lithographic plate was prepared in the same manner as in Example 53, except that the polyol (54) was used in place of the polyol (51). The microcapsules had the average particle size of 0.33 µm.

The prepared plate was processed, printed and evaluated in the same manner as in Example 41.

As a result, a development was conducted on machine without any problems. The plate wear was 25,000 sheets.

EXAMPLE 55

A presensitized lithographic plate was prepared in the same manner as in Example 53, except that the polyol (57) was used in place of the polyol (51). The microcapsules had the average particle size of 0.31 µm.

The prepared plate was processed, printed and evaluated in the same manner as in Example 41.

As a result, a development was conducted on machine without any problems. The plate wear was 25,000 sheets.

EXAMPLE 56

A presensitized lithographic plate was prepared in the same manner as in Example 53, except that the polyol (60) was used in place of the polyol (51). The microcapsules had the average particle size of 0.34 µm.

The prepared plate was processed, printed and evaluated in the same manner as in Example 41.

As a result, a development was conducted on machine without any problems. The plate wear was 31,000 sheets.

EXAMPLE 57

A presensitized lithographic plate was prepared in the same manner as in Example 53, except that the polyol (66) was used in place of the polyol (51). The microcapsules had the average particle size of 0.30 µm.

The prepared plate was processed, printed and evaluated in the same manner as in Example 41.

As a result, a development was conducted on machine without any problems. The plate wear was 25,000 sheets.

EXAMPLE 58

A presensitized lithographic plate was prepared in the same manner as in Example 53, except that the polyol (74) was used in place of the polyol (51). The microcapsules had the average particle size of 0.33 µm.

The prepared plate was processed, printed and evaluated in the same manner as in Example 41.

As a result, a development was conducted on machine without any problems. The plate wear was 30,000 sheets.

Comparison Example 6

In 17 g of ethyl acetate, 10 g of the adduct of trimethylol propane and m-xylylene diisocyanate (Takenate D-110N, Mitsui Takeda Chemicals, Inc.), 2 g of tetramethylolpropane tetraacrylate, 2 g of allyl methacrylate/butyl methacrylate copolymer (copolymerization ratio=7/3), 1.5 g of the agent capable of converting light to heat used in Example 1, 0.4 g of the iodonium compound used in Example 21 and 0.1 g of an anionic surface active agent (Bionine A-41-C, Takemoto Oil & Fat Co., Ltd.) were dissolved to prepare an oily phase.

A presensitized lithographic plate was prepared in the same manner as in Example 53, except that the above-prepared oily phase was used. The microcapsules had the average particle size of 0.34 μm.

The prepared plate was processed, printed and evaluated in the same manner as in Example 41.

As a result, a development was conducted on machine without any problems. However, the plate wear was 7,000 sheets.

What is claimed is:

1. A presensitized lithographic printing plate which comprises a hydrophilic support and an image-forming layer containing microcapsules which have a shell comprising a polymer and a core comprising a polymerizable compound, wherein the polymer has a decomposition temperature in the range of 150 to 280° C., and wherein the image-forming layer or another optional layer further contains an agent capable of converting light to heat.

2. The presensitized lithographic printing plate as claimed in claim 1, wherein the polymer is polyurethane, polyurea or a copolymer thereof.

3. The presensitized lithographic printing plate as claimed in claim 2, wherein the polyurethane, the polyurea or the copolymer thereof is a reaction product of a polyol and a polyisocyanate.

4. The presensitized lithographic printing plate as claimed in claim 3, wherein the polyol has phenolic hydroxyl groups.

5. The presensitized lithographic printing plate as claimed in claim 4, wherein the polyol has three or more phenolic hydroxyl groups.

6. The presensitized lithographic printing plate as claimed in claim 4, wherein the polyol is represented by the formula (I):

in which $L^1$ is an n-valent linking group; Ar is an arylene group or a substituted arylene group; and n is an integer of 2 or more.

7. The presensitized lithographic printing plate as claimed in claim 2, wherein the polymer contains a thermally decomposable bond having a decomposition temperature that is lower than a decomposition temperature of a urethane bond or a urea bond contained in the polyurethane, the polyurea or the copolymer thereof.

8. The presensitized lithographic printing plate as claimed in claim 7, wherein a difference between the decomposition temperature of the thermally decomposable bond and the decomposition temperature of the urethane bond or the urea bond is 10° C. or more.

9. The presensitized lithographic printing plate as claimed in claim 7, wherein the thermally decomposable bond is a sulfonic ester bond.

10. The presensitized lithographic printing plate as claimed in claim 3, wherein the polyol contains a sulfonic ester bond.

11. The presensitized lithographic printing plate as claimed in claim 10, wherein the poiyoi is represented by the formula (II):

in which L2 is an m-valent linking group; —SO$_3$— is —SO$_2$—O— or —O—SO$_2$—; $L^3$ is a divalent linking group; and m is an integer of 2 to 6.

12. The presensitized lithographic printing plate as claimed in claim 3, wherein the polyisocyanate is a diisocyanate.

13. The presensitized lithographic printing plate as claimed in claim 12, wherein the diisocyanate is xylylene diisocyanate.

14. The presensitized lithographic printing plate as claimed in claim 1, wherein the polymerizable compound has an ethylenically unsaturated group.

15. The presensitized lithographic printing plate as claimed in claim 14, wherein the image-forming layer further contains a thermal polymerization initiator.

16. The presensitized lithographic printing plate as claimed in claim 1, wherein the polymerizable compound is a vinyl ether or a cyclic ether.

17. The presensitized lithographic printing plate as claimed in claim 16, wherein the image-forming layer further contains a heat sensitive acid precursor.

18. The presensitized lithographic printing plate as claimed in claim 1, wherein the microcapsules contain the agent capable of converting light to heat.

19. A lithographic process comprising the steps of: imagewise heating a presensitized lithographic printing plate which comprises a hydrophilic support and an image-forming layer containing microcapsules which have a shell comprising a polymer and a core comprising a polyrnerizable compound, said polymer having a decomposition temperature in the range of 150 to 280° C., whereby the shell is decomposed and the polymerizable compound is polymerized to form a hydrophobic area; and removing the unheated area of the image-forming layer to form a lithographic printing plate.

20. A lithographic printing process comprising the steps of: imagewise heating a presensitized lithographic printing plate which comprises a hydrophilic support and an image-forming layer containing microcapsules which have a shell comprising a polymer and a core comprising a polymerizable compound, said polymer having a decomposition temperature in the range of 150 to 280° C., whereby the shell is decomposed and the polymerizable compound is polymerized to form a hydrophobic area; working a printer to remove the unheated area of the image-forming layer and to form a lithographic printing plate while attaching the plate to the printer; and printing with the formed plate by supplying oily ink and dampening water to the plate.

* * * * *